United States Patent [19]
Takahashi et al.

[11] Patent Number: 6,031,779
[45] Date of Patent: Feb. 29, 2000

[54] DYNAMIC MEMORY

[75] Inventors: Yasushi Takahashi, Urawa; Tsutomu Takahashi, Tokyo; Kouji Arai, Kodaira; Tsugio Takahashi, Hamura, all of Japan; Shunichi Sukegawa; Shinji Bessho, both of Plano, Tex.; Masayuki Hira, Dallas, Tex.

[73] Assignees: Hitachi, Ltd., Tokyo, Japan; Texas Instruments Incorporated, Dallas, Tex.

[21] Appl. No.: 09/058,147

[22] Filed: Apr. 10, 1998

[30] Foreign Application Priority Data

Apr. 10, 1997 [JP] Japan .................................. 9-108111

[51] Int. Cl.[7] ........................................ G11C 7/00
[52] U.S. Cl. ................... 365/226; 365/189.09; 365/205; 365/203
[58] Field of Search .............................. 365/226, 189.09, 365/205, 203

[56] References Cited

U.S. PATENT DOCUMENTS 5,398,207  3/1995  Tsuchida et al. .................... 365/226
5,646,900  7/1997  Tsukude et al. ..................... 365/205

*Primary Examiner*—Huan Hoang
*Attorney, Agent, or Firm*—Antonelli, Terry, Stout & Kraus, LLP

[57] ABSTRACT

Described herein is a dynamic memory. An N channel type voltage clamp MOSFET is provided which has a drain supplied with a supply voltage supplied from an external terminal, a gate to which a boosted constant voltage is applied, and a source which outputs a constant voltage. The clamp voltage outputted from the source of the voltage clamp MOSFET is supplied to a common source line for each of P channel type amplification MOSFETs constituting a sense amplifier via a P channel type first power MOSFET switch-controlled by a sense amplifier activation signal, as a voltage for operating the sense amplifier. Further, the constant voltage outputted from the source of the voltage clamp MOSFET is supplied to an N-well region in which the P channel type first power MOSFET and the P channel type MOSFETs constituting the sense amplifier are formed, as a bias voltage.

18 Claims, 13 Drawing Sheets

DYNAMIC MEMORY

BACKGROUND OF THE INVENTION

This invention relates to a dynamic RAM (Random Access Memory) and a technique effective for use in the formation of a high level stored in a storage capacitor by a stepped-down internal voltage while utilizing a division word line system having main word lines and sub-word lines, for example.

A division word line system provided with a plurality of sub-word lines connected to memory cells with respect to main word lines has been proposed to activate only a necessary memory block provided with a selected memory cell and reduce memory areas to be activated wherever possible to thereby provide less power consumption and to speed up the operation of selecting one of sub-word lines connected to the memory cells. An example of this type of division word line system has been described in U.S. application Ser. No. 08/503,738 (corresponding to Japanese Patent Application Laid-Open No. 1-286197).

Further, a system for forming a pair of PMOS transistors constituting a sense amplifier in a N-well region and supplying an internal step-down or deboosted voltage to the N-well region has been described in Japanese Patent Application Laid-Open Nos. 1-187856 and 2-18784.

SUMMARY OF THE INVENTION

When a high level on one of the bit lines is written into a dynamic memory cell comprised of a storage capacitor and an address selection MOSFET, it is necessary to set a word line selection level to a high voltage boosted by a threshold voltage of the address selection MOSFET with respect to the high level on the bit line. Namely, the word line selection level is determined on the basis of the high level of the bit line. With miniaturization of a device incident to a great increase in storage capacity, a gate oxide film of the address selection MOSFET is also rendered thin and correspondingly the electric-field intensity of the gate oxide film presents a problem. It is therefore considered that a supply voltage supplied from an external terminal is deboosted or reduced to form or produce a regulated internal voltage, whereby the word line selection level is lowered. In doing so, however, each of the sense amplifiers, which forms an amplified signal corresponding to the high level of the bit line, is reduced in operating voltage so that its operating speed is rendered slow.

If an overdrive system, for increasing the operating voltage of the sense amplifier upon the initiation of operation of the sense amplifier to speed up the operating speed of the sense amplifier and for speeding up the rise of the high level of the bit line upon the initiation of amplification of the sense amplifier, is adopted, or a system for divisionally providing word lines with the great increase in storage capacity is adopted, then the sense amplifiers and their driver circuits provided around a memory array increase in complexity. Thus, an important problem is how to lay out these components around the memory array with efficiency while preventing circuit operating voltages from being latched up over a wide range.

An object of the present invention is to provide a dynamic RAM capable of high integration and increased speed. The above and other objects, and novel features of the present invention will become apparent from the description of the present specification and the accompanying drawings.

A summary of a typical one of the inventive aspects disclosed in the present application will be simply described as follows: An N channel type voltage clamp MOSFET is provided which has a drain supplied with a supply voltage from an external terminal, a gate to which a boosted constant voltage is applied, and a source which outputs a constant voltage. The clamp voltage outputted from the source of the voltage clamp MOSFET is supplied to a common source line for P channel type amplification MOSFETs constituting a sense amplifier via a P channel type first power MOSFET switch-controlled by a sense amplifier activation signal, as a voltage for operating the sense amplifier. Further, the constant voltage outputted from the source of the voltage clamp MOSFET is supplied as a bias voltage to an N-well region in which the P channel type first power MOSFET and the P channel type MOSFETs constituting the sense amplifier are formed.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Figure 1:
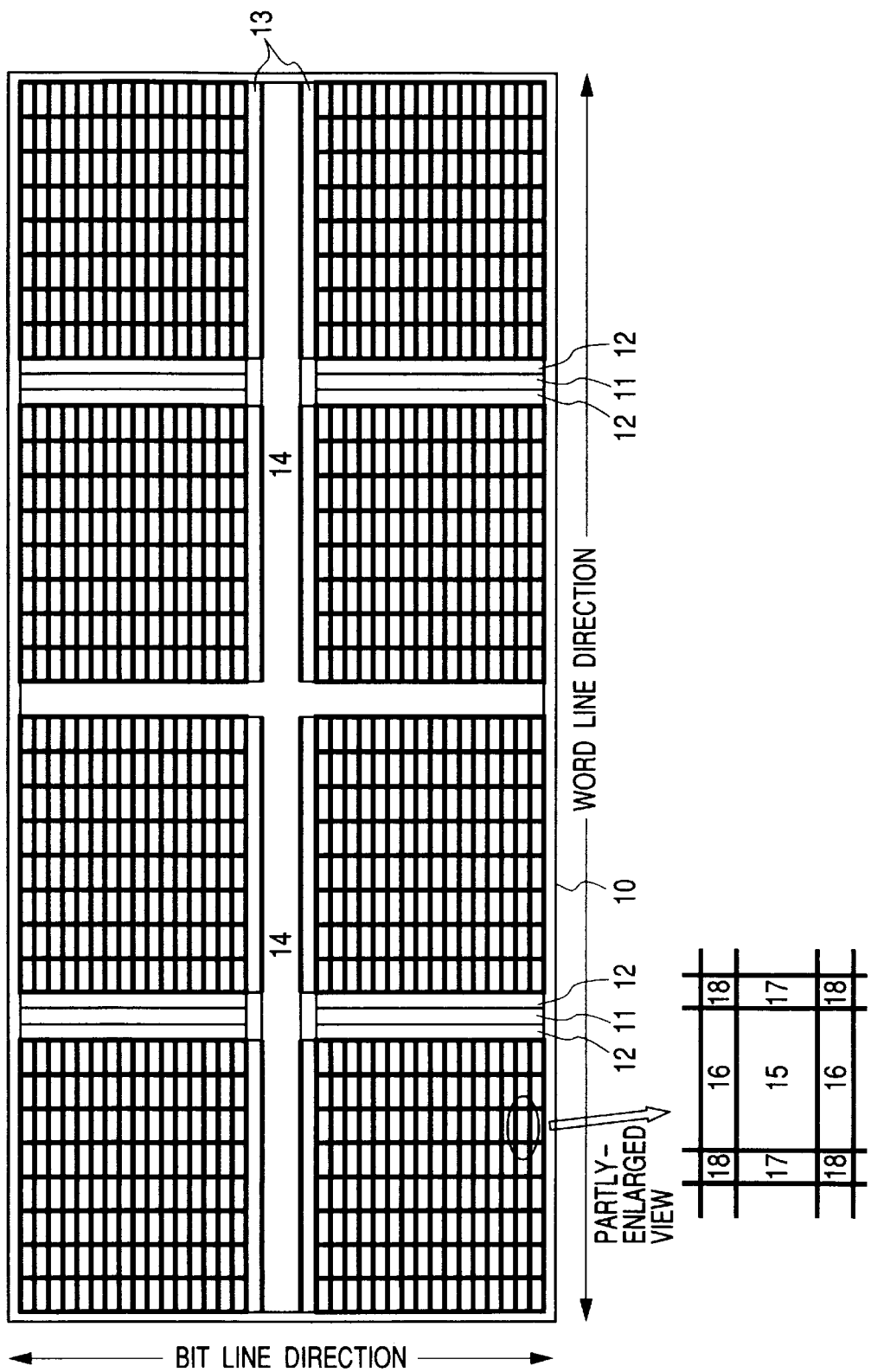
FIG. 1 is a layout diagram showing one embodiment of a dynamic RAM according to the present invention.

FIG. 1 is a schematic layout diagram showing one embodiment of a dynamic RAM according to the present invention. A portion related to the present invention, of respective circuit blocks that constitute the dynamic RAM, is shown in the same drawing, as will be understood therefrom. The circuit blocks are formed on a single semiconductor substrate, such as monocrystal silicon in accordance with the known manufacturing technology for semiconductor integrated circuits.

In the present embodiment, a memory array is divided into four parts. The memory arrays are separately provided in pairs from side to side with respect to the longitudinal direction of a semiconductor chip. Further, an address input circuit, a data input/output circuit and an input/output interface circuit comprised of a row of bonding pads, etc. are provided in central portions 14. Column decoder areas 13 are respectively placed in portions contiguous to the memory arrays located on both sides of these central portions 14.

In the individual memory arrays comprised of four parts divided into pairs on both sides and up and down with respect to the longitudinal direction of the semiconductor chip as described above, main row decoder areas 11 are provided in upper and lower central portions with respect to the longitudinal direction of the semiconductor chip. Main word driver areas 12 are respectively formed above and below the main row decoder areas 11 so as to drive main word lines for the memory arrays divided into the upper and lower parts.

The memory cell array (sub-array) 15 is formed so as to be surrounded by sense amplifier areas 16 and sub-word driver areas 17 with the memory cell array 15 interposed therebetween, as shown in enlarged view. Portions where the sense amplifier areas 16 and the sub-word driver areas 17 intersect, respectively, are called intersecting areas (cross areas) 18. Sense amplifiers provided in the sense amplifier areas 16 are configured in accordance with a shared-sense system. Complementary bit lines are respectively provided on both side of the sense amplifiers with the sense amplifiers as the centers exclusive of the sense amplifiers placed at both ends of the memory cell arrays. Further, the sense amplifiers are selectively connected to their corresponding complementary bit lines for either one of the side-to-side memory cell arrays.

As described above, the memory arrays divided into four parts on either side with respect to the longitudinal direction of the semiconductor chip are arranged in pairs. The two memory arrays arranged in pairs in this way are constructed such that the main row decoder areas 11 and the main word driver areas 12 are respectively placed in their central portions. Each main row decoder area 11 is provided in common with respect to the two memory arrays distributed to the upper and lower portions with the main row decoder area 11 as the center. Each main word driver area 12 forms or produces a signal for selecting a main word line which extends so as to penetrate one memory array referred to above. Further, sub-word selection drivers are also provided in the main word driver areas 12. As will be described later, each sub-word selection driver extends in parallel to the main word line and produces a signal for selecting a sub-word select line.

One memory cell array (sub-array) 15 shown in enlarged view comprises 256 sub-word lines and complementary bit lines (or data lines) orthogonal thereto provided as 256 pairs, although they are not shown in the drawing. Since the sixteen memory cell arrays (sub-arrays) 15 are provided in a word bit line direction in one memory array referred to above, about 4K sub-word lines are provided as a whole. On the other hand, since the eight memory cell arrays are provided in a word line direction, about 2K complementary bit lines are provided as a whole. Since eight memory arrays are provided as a whole, the memory chip has a mass storage capacity of 64 Mbits=8×2K×4K in all.

One memory array referred to above is divided into eight parts along the direction of the main word line. Sub-word drivers (sub-word line driving circuits) 17 are provided for every memory cell arrays 15 divided in this way. The sub-word drivers 17 are respectively divided into lengths of one-eighth the main word line. Each individual sub-word driver 17 forms or produces a signal for selecting the corresponding sub-word line extended in parallel thereto. In the present embodiment, the four sub-word lines are arranged for each main word line in the complementary bit-line direction to decrease the number of the main word lines, in other words, to reduce the wiring pitch of each main word line. A sub-word selection driver is provided to select one sub-word line from the sub-word lines divided into eight along the main word-line direction and assigned in the complementary bit-line direction by four. The sub-word selection driver produces a signal for selecting one of the four sub-word select lines which extend in the direction of an arrangement of the sub-word drivers.

If attention is paid to one memory array referred to above, then the sub-word driver corresponding to one memory cell array including a memory cell to be selected, of the eight memory cell arrays assigned to one main word line selects one sub-word select line. As a result, one corresponding sub-word line is selected from the sub-word lines corresponding to 32 lines=8×4 that belong to one main word line. Since there are provided 2K (2048) memory cells along the main word-line direction as described above, 2048/8=256 memory cells are electrically connected to one sub-word line. Although the invention is not restricted in particular, eight sub-word lines corresponding to one main word line are placed in a selected state upon a refresh operation (e.g., a self-refresh mode).

As described above, each memory array has a storage capacity of 4 Kbits with respect to the complementary bit-line direction. However, if the memory cells having a storage capacity equivalent to 4 Kbits are electrically connected to each complementary bit line, then the parasitic capacity of each complementary bit line increases and a signal level read based on the capacity ratio of the above capacity to the capacitance of a micro information storage capacitor is not obtained. Therefore, the memory array is divided into sixteen parts in the complementary bit-line direction. Namely, the complementary bit lines are divided into sixteen parts by the sense amplifiers 16 indicated by thick black lines. The sense amplifiers 16 are configured in accordance with the shared-sense system. The complementary bit lines are respectively provided on both sides of the sense amplifiers with the sense amplifiers as the centers exclusive of the sense amplifiers placed at both ends of the memory array. Further, each of the sense amplifiers is selectively connected to either of the side-to-side complementary bit lines.

Figure 2:
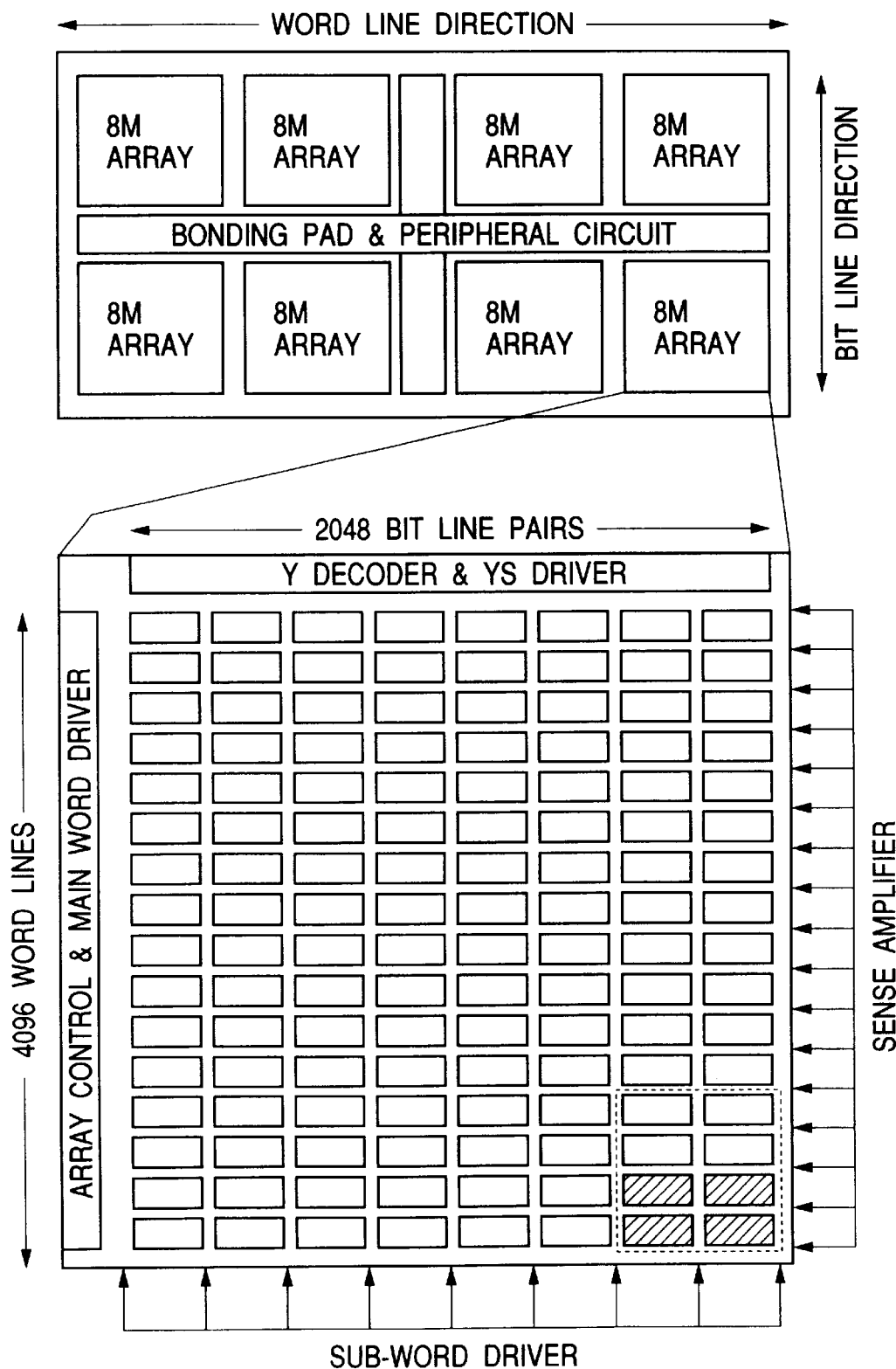
FIG. 2 is a schematic layout diagram for describing the dynamic RAM according to the present invention.

FIG. 2 is a schematic layout diagram for explaining the dynamic RAM according to the present invention. The same drawing illustrates a schematic layout of the entire memory chip and a layout of one memory array divided into eight parts. FIG. 2 is a diagram in which the embodiment shown in FIG. 1 is illustrated from another point of view. Namely, the memory chip is configured similarly to FIG. 1 so that the memory arrays (Arrays) respectively provided on both sides and upward and downward in pairs with respect to the longitudinal direction (word line direction) of the memory chip are divided into four parts and a plurality of bonding pads and peripheral circuits (Bonding Pad & peripheral Circuit) are provided in a central portion extending in the longitudinal direction thereof.

Each of the memory arrays provided in pairs has a storage capacity of about 8 Mbits. As one of them is illustrated in an enlarged form, sub-arrays divided into eight in the word line direction and divided into sixteen in a bit line direction are provided in each memory array. Sense amplifiers (Sense Amplifiers) are respectively placed on both sides in the bit line direction of each sub-array along the bit line direction. Sub-word drivers (Sub-Word Drivers) are respectively placed on both sides in the word line direction of each sub-array.

Each individual memory array is provided with 4096 word lines and complementary bit lines set in 2048 pairs as a whole. Thus, each memory array has a storage capacity of about 8 Mbits in total. Since the 4096 word lines are arranged for the sixteen sub-arrays in divided form as described above, the 256 word lines (sub-word lines) are provided for each sub-array. Since the 2048 pairs of complementary bit lines are arranged for the eight sub-arrays in divided form as described above, the 256 pairs of complementary bit lines are provided for each sub-array.

A main row decoder is provided at the central portion between the two memory arrays. Namely, an array control (Array Control) circuit and a main word driver (Main Word Driver) are provided on the left side of the memory array so as to correspond to the main row decoder provided in common with respect to the memory array provided on the right side thereof. The array control circuit is provided with a driver for driving a first sub-word select line. Each main word line is extended so as to penetrate the eight sub-arrays. The main word driver drives the main word line. Similarly to the main word line, the first sub-word select line is also extended so as to penetrate the eight sub-arrays. A Y decoder (YDecoder) and a Y select line driver (YSdriver) are provided at an upper portion of the memory array.

Figure 3:
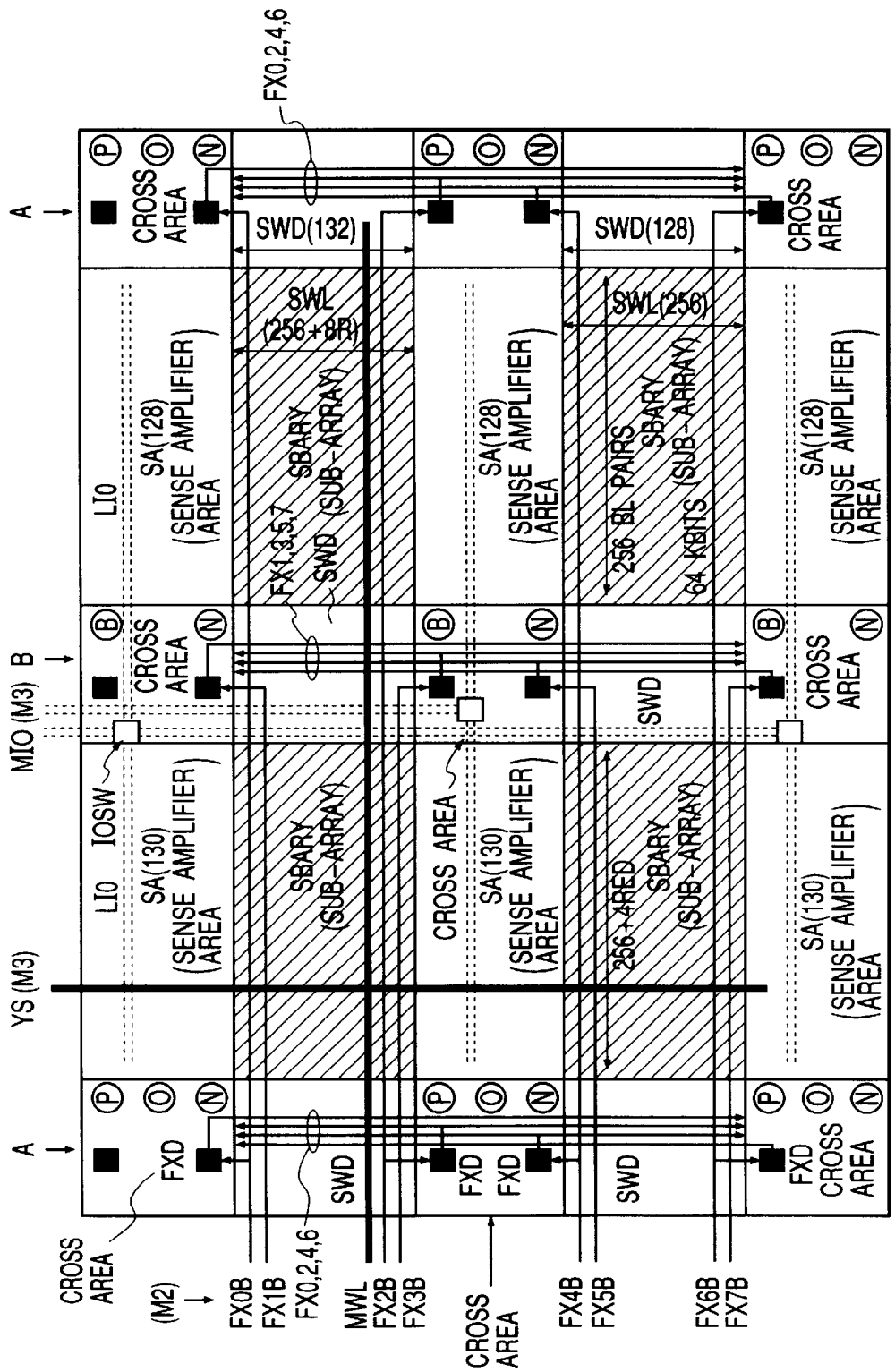
FIG. 3 is a schematic layout diagram illustrating embodiments of sub-arrays and their peripheral circuits employed in the dynamic RAM according to the present invention.

FIG. 3 schematically shows the layout of sub-arrays and their peripheral circuits employed in the dynamic RAM according to the present invention. Four sub-arrays SBARY located at cross-hatched positions in the memory array shown in FIG. 2 are illustrated in the same drawing as typical ones. Areas to form the sub-arrays SBARY are cross-hatched to distinguish sub-word driver areas, sense amplifier areas and cross areas from one another provided around the areas where the sub-arrays SBARY are formed.

The sub-arrays SBARY are classified into the following four types. Namely, if the direction of an extension of each word line is defined as the horizontal direction, then the first sub-array SBARY placed below the right comprises 256 sub-word lines SWL and 256 pairs of complementary bit lines. Therefore, 256 sub-word drivers SWD corresponding to the 256 sub-word lines SWL are placed on both sides of the first sub-array SBARY iin two groups of 128. 256 sense amplifiers SA provided so as to correspond to the 256 pairs of complementary bit lines BL are configured in accordance with the above-described shared sense amplifier system and placed on the upper and lower sides of the first sub-array SBARY in groups of 128.

The second sub-array SBARY placed above the right is provided with eight spare word lines in addition to 256 normal sub-word lines SWL. Therefore, 264 sub-word drivers SWD associated with the above 256+8 sub-word lines SWL are placed on both sides of such a sub-array as two groups of 132. As described above, the right-below sub-array comprises 256 pairs of complementary bit lines BL. Similarly to the above, 128 sense amplifiers are placed up and down. The 128 pairs of complementary bit lines formed in the sub-arrays SBARY placed at the up-and-down positions of the right side are connected in common to the sense amplifier SA interposed therebetween through shared switches MOSFET.

The third sub-array SBARY placed below the left as described above comprises 256 sub-word lines SWL in a manner similar to the sub-array SBARY adjacent to the right side thereof. In the same manner as described above, 128 sub-word drivers are placed in divided form. 128 sub-word lines SWL of the sub-arrays SBARY placed from side to side as seen on the lower side are electrically connected in common to 128 sub-word drivers SWD formed in a region interposed therebetween. The sub-array SBARY placed below the left as described above is provided with four pairs of spare bit lines 4RED in addition to 256 pairs of normal complementary bit lines BL. Therefore, 260 sense amplifiers SA corresponding to the 260 pairs of complementary bit lines BL are placed on the upper and lower sides of such a sub-array as two goups of 130.

The fourth sub-array SBARY placed above the left as described above is provided with 256 normal sub-word lines SWL and eight spare sub-word lines R in a manner similar to the sub-array SBARY adjacent to the right side thereof. Further, the fourth sub-array SBARY is provided with four pairs of spare bit lines in addition to 256 pairs of normal complementary bit lines in a manner similar to the sub-array adjacent to the side therebelow. Therefore, sub-word drivers are placed on the left and right sides as groups of 132 and sense amplifiers SA are arranged as groups of 130 up and down.

A main word line MWL is extended as shown as a typical one. Further, a column select line YS is extended in the vertical direction of FIG. 3 as shown as a typical one. The sub-word lines SWL are placed in parallel to the main word line MWL, and complementary bit lines BL (not shown) are placed in parallel to the column select line YS. In the present embodiment, the eight sets of sub-arrays and the four sets of sub-arrays are respectively configured in the bit line and word line directions in the 8-Mbit memory array as shown in FIG. 2 with the four sub-arrays as the basic unit. Since one pair of sub-arrays is provided four, the sub-arrays corresponding to 128=8×4×4 are provided within the 8-Mbit memory array. Since the overall chip consists of eight 8-Mbit memory arrays, sub-arrays corresponding to 1024= 128×8 in number are formed in the entire memory chip.

Eight sub-word select lines FX0B through FX7B with respect to the four sub-arrays are extended so as to penetrate or pass through the four sets of (eight) sub-arrays in a manner similar to the main word line MWL. Further, the four sub-word select lines of FX0B through FX3B and the four sub-word select lines of FX4B through FX7B are extended on the up-and-down sub-arrays in parts. Thus, the reason why one pair of sub-word select lines FX0B through FX7B are assigned to the two sub-arrays and they are allowed to extend on the sub-arrays, is to reduce the size of the memory chip.

Namely, when the eight sub-word select lines FX0B through FX7B are assigned to their corresponding sub-arrays and formed on sixteen sense amplifier areas in the form of wiring channels, sixteen sub-arrays as in the memory array shown in FIG. 2 amounting to 32 in total are provided for the up-and-down memory arrays. It is therefore necessary to provide wiring channels of 8×32=256. In the aforementioned embodiment on the other hand, the conductors or wires themselves can form the wiring channels without the provision of special wiring channels by assigning the eight sub-word select lines FX0B through FX7B to the two sub-arrays and placing them so that they pass over the sub-arrays.

To begin with, one main word line is provided on the sub-arrays for the eight sub-word lines, and the sub-word select lines for selecting one of the eight sub-word lines are needed. The writing pitch of each main word line is widened to form the main word line in the proportions of one main word line to the eight sub-word lines formed according to the pitch of each memory cell. Thus, the sub-word select lines can be formed between the main word lines with relative ease by utilizing a wired layer identical to the main word line.

As will be described later, each of the sub-word drivers employed in the present embodiment takes such a configuration as to select one sub-word line SWL by using a select signal supplied through the sub-word select line FX0B or the like and a select signal obtained by inverting the select signal. The sub-word driver takes such a configuration as to simultaneously select the sub-word lines SWL for the sub-arrays placed on both sides with each sub-word driver as the center. Therefore, the four sub-word select lines are distributively provided for the sub-word drivers of 128×2=256 for the two sub-arrays as described above. Namely, if attention is paid to the sub-word select line FX0B, it is then necessary to supply a select signal to each of the sub-word drivers corresponding to 256÷4=64.

If one line extended parallel to the main word line MWL is defined as the first sub-word select line FX0B, then a second sub-word line FXO for supplying a select signal to each of the vertically-arranged 64 sub-word drivers through each of sub-word select line driver circuits FXD, which is provided in the cross area located at the left upper portion and receives a select signal from the first sub-word select line FX0B, is provided. The first sub-word select line FX0B is extended parallel to the main word line MWL and the sub-word lines SWL, whereas the second sub-word select lines are extended parallel to the column select line YS and complementary bit lines BL orthogonal thereto. In contrast, with the eight first sub-word select lines FX0B through FX7B, the second sub-word select lines FX0 through FX7 are divided into even numbers FX0, 2, 4 and 6 and odd numbers FX1, 3, 5 and 7, which in turn are placed so as to be distributed to the sub-word drivers SWD provided on both sides of each sub-array SBARY.

The sub-word select line driver circuits FXD are placed so as to be distributed to the upper and lower sides of one cross area by two as indicated by ■ in the drawing. Namely, in the cross area located at the left upper portion as described above, the sub-word select line driver circuit disposed on the lower side thereof corresponds to the first sub-word select line FX0B. Further, the two sub-word select line driver circuits FXD provided in the cross area located at the left intermediate portion correspond to the first sub-word select lines FX2B and FX4B respectively. Moreover, the sub-word select line driver circuit provided in the left-lowered cross area and located on the upper side thereof corresponds to the first sub-word select line FX6B.

In the cross area located at the central upper portion, the sub-word select line driver circuit disposed on the lower side thereof corresponds to the first sub-word select line FX1B. The two sub-word select line driver circuits FXD provided in the cross area located at the central intermediate portion are associated with the first sub-word select lines FX3B and FX5B. The sub-word select line driver circuit provided in the cross area at the central lower portion and disposed on the upper side thereof corresponds to the first sub-word select line FX7B. In the cross area provided at the right upper portion, the sub-word select line driver circuit disposed on the lower side thereof corresponds to the first sub-word select line FX0B. The two sub-word select line driver circuits FXD provided in the cross area placed at the right intermediate portion are associated with the first sub-word select lines FX2B and FX4B respectively. The sub-word select line driver circuit provided in the cross area at the right lower portion and disposed on the upper side thereof corresponds to the first sub-word select line FX6B. Thus, the sub-word drivers provided at the end of each memory array drive the sub-word lines SWL provided on the left side alone because no sub-arrays exist on the right sides thereof.

As in the present embodiment, the placement of the sub-word select lines in the pitch of the main word line on the sub-arrays can eliminate the need for special wiring channels. Therefore, even if the eight sub-word select lines are placed on one sub-array, the memory chip does not increase in size. However, the areas increase to form the above-described sub-word select line driver circuits FXD, thus interfering with high integration of the memory chip. Namely, this is because each cross area referred to above has no allowance for the formation of peripheral circuits, such as switch circuits IOSW provided so as to correspond to main input/output lines MIO and sub input/output lines LIO indicated by broken lines in the drawing, power MOSFETs for respectively driving the sense amplifiers, driver circuits for driving the shared switch MOSFETs, driver circuits for driving precharge MOSFETs, etc.

In the sub-word drivers, as will be described subsequently, the second sub-word select lines FX0 through FX6 and the like are provided with wires for allowing select signals corresponding to the first sub-word select lines FX0B through FX6B to pass therethrough in parallel to the second sub-word select lines FX0 through FX6. However, since their loads are small as will be described later, the sub-word select lines are formed by wires directly connected to the first sub-word select lines FX0B through FX6B without providing the special driver circuits FXD as in the second sub-word select lines FX0 through FX6. However, one identical to that for each of the second sub-word select lines FX0 through FX6 is used as a wired layer used for each individual wire referred to above.

Of the above-described cross areas, those placed in the extending direction A of the second sub-word select lines FX0 through FX6 corresponding to the even numbers include N channel type power MOSFETs for respectively supplying a stabilized internal voltage VDL to the sense amplifiers, as indicated by P inserted into circles o, P channel type power MOSFETs for respectively supplying an overdriving clamp voltage VDDCLP to be described later to the sense amplifiers, as indicated by o inserted into circles o, and N channel type power MOSFETs for respectively supplying a circuit ground potential VSS to the sense amplifiers, as indicated by N inserted into circles o.

Of the above-described cross areas, those placed in the extending direction B of the second sub-word select lines FX0 through FX6 corresponding to the odd numbers include N channel type drive MOSFETs for respectively bringing precharge and equalize MOSFETs for the bit lines to an off state, as indicated by B inserted into circles o, and N channel type power MOSFETs for respectively supplying a circuit ground potential VSS to the sense amplifiers, as indicated by N inserted into circles o. Each of the N channel type power MOSFETs supplies the ground potential from both sides of the sense amplifier row to the source of an amplification MOSFET of the N channel type MOSFETs constituting the sense amplifiers. Namely, both the N channel type power MOSFET provided in the cross area on the A side and the N channel type power MOSFET provided in the cross area on the B side supply the ground potential to the 128 or 130 sense amplifiers provided in each sense amplifier area.

As described above, each sub-word line driver circuit SWD selects the sub-word lines for the sub-arrays on both sides thereof with the sub-word line driver circuit SWD as the center. On the other hand, the two sense amplifiers are activated in association with the selected sub-word lines. In other words, this is because when the corresponding sub-word line is placed in a selected state, an address selection MOSFET is brought to an on state so that the electrical charge stored in a storage capacitor is combined with the electrical charge on each bit line, whereby there is a need to perform a re-write operation for activating the sense amplifiers so as to restore the storage capacitor to the original charged state. Therefore, the power MOSFETs indicated by P, O and N referred to above are used to activate the sense amplifiers on the both sides with the power MOSFETs interposed therebetween exclusive of those corresponding to each sub-array at the above-described end.

On the other hand, since the sub-word line driver circuit SWD provided on the right side of the sub-array placed at the end of the memory array selects only the sub-word line for each sub-array, the power MOSFETs indicated by P, O and N referred to above activate only the sense amplifiers corresponding to the sub-array.

The sense amplifier is configured in accordance with the shared-sense system. The shared switch MOSFET corresponding to the complementary bit lines on the non-selected side of the sub-word lines, of the sub-arrays placed on both sides with the sense amplifier interposed therebetween is turned off and thereby disconnected from the corresponding sense amplifier, whereby the re-write operation for amplifying a signal read from the complementary bit line pair corresponding to the selected sub-word line and restoring the storage capacitor of each memory cell to the original charged state is performed.

Figure 4:
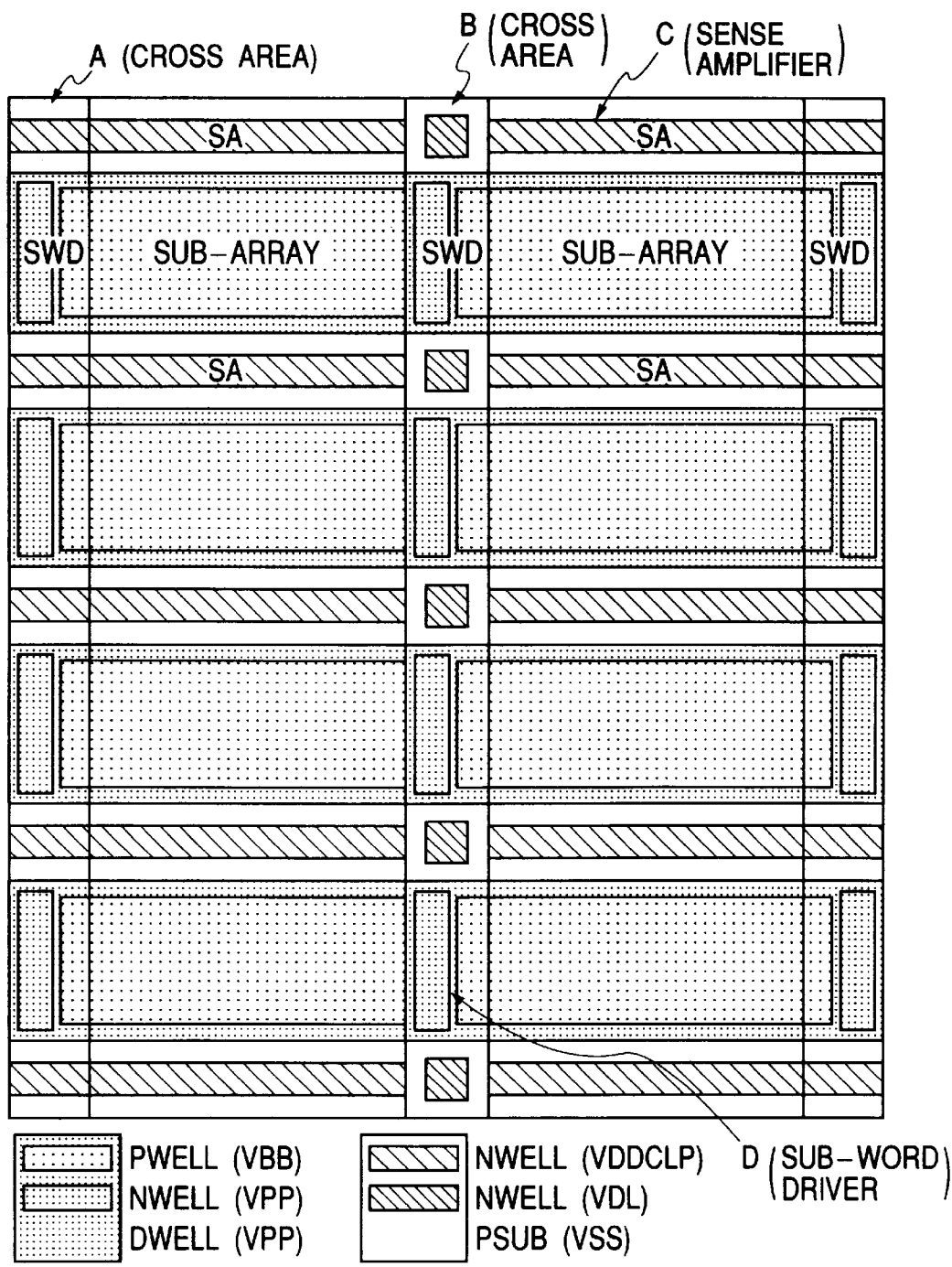
FIG. 4 is a schematic layout diagram depicting embodiments of well regions forming the sub-arrays and their peripheral circuits employed in the dynamic RAM according to the present invention.

FIG. 4 schematically shows the layout of well areas or regions for forming sub arrays and their peripheral circuits employed in the dynamic RAM according to the present invention. In the drawing, eight arrays including the four sub-arrays SBARY disposed at the cross-hatched positions are illustratively shown as typical ones, and have been surrounded by the dotted line in the memory array shown in FIG. 2.

In the same drawing, each of the blank or white areas indicates a P-type substrate (PSUB). The P-type substrate PSUB is supplied with a circuit ground potential VSS. Two types of N-well regions NWELL (VDL) and NWELL (VDDCLP) are formed in the P-type substrate PSUB and are cross-hatched. Namely, an N-well region for forming a P-channel type amplification MOSFET constituting a sense amplifier SA and an N-well region for forming the power switch MOSFET located in the cross area in the A row are supplied with a clamp voltage VDDCLP produced using a boost voltage VPP.

Each of N-well regions, which forms the P-channel type MOSFET constituting the switch circuit IOSW provided so as to correspond to the sub input/output line pair LIO and the precharge and equalize P-channel type MOSFETs provided so as to correspond to the main input/output line pair, is formed in the cross area in the B row and supplied with a step-down produced internal voltage VDL.

Each of the deep-shaped N-well regions DWELL is formed in the entire area where the sub-arrays and the sub-word line driver circuits SWD are formed. The deep-shaped N-well region is supplied with the boost voltage VPP corresponding to a word-line selection level. An N-well region NWELL for forming the P-channel MOSFET constituting the sub-word line driver circuit SWD is formed in each deep-shaped N-well region DWELL and is supplied with the boost voltage VPP in a manner similar to the deep-shaped N-well region DWELL.

Each of the P-well regions PWELL, for forming an N channel type address selection MOSFET constituting each memory cell and an N channel type MOSFET for each sub-word line driver circuit SWD, is formed in the deep-shaped N-well region DWELL. These P-well regions PWELL are supplied with a substrate back-biased voltage VBB set to a negative voltage.

Let's take a look at one of the eight arrays shown in FIG. 2. Each deep-shaped N-well region DWELL is formed so that the sixteen sub-arrays are arranged in the bit line direction in all with the eight sub-arrays placed in association with the word line direction as one unit. The cross area corresponding to the sub-word drivers (Sub-Word Driver) placed at both ends of each main word line extended on the array is defined as the A row. Similarly, the cross area corresponding to the sub-word drivers is defined as the B row. Thus, the cross areas are placed in alternate order. Therefore, the N-well regions NWELL (VDDCLP) for forming the P channel type MOSFETs of two sense amplifiers (Sense Amplifiers) placed in the A row and on both sides thereof are provided in common exclusive of the ends.

Figure 5:
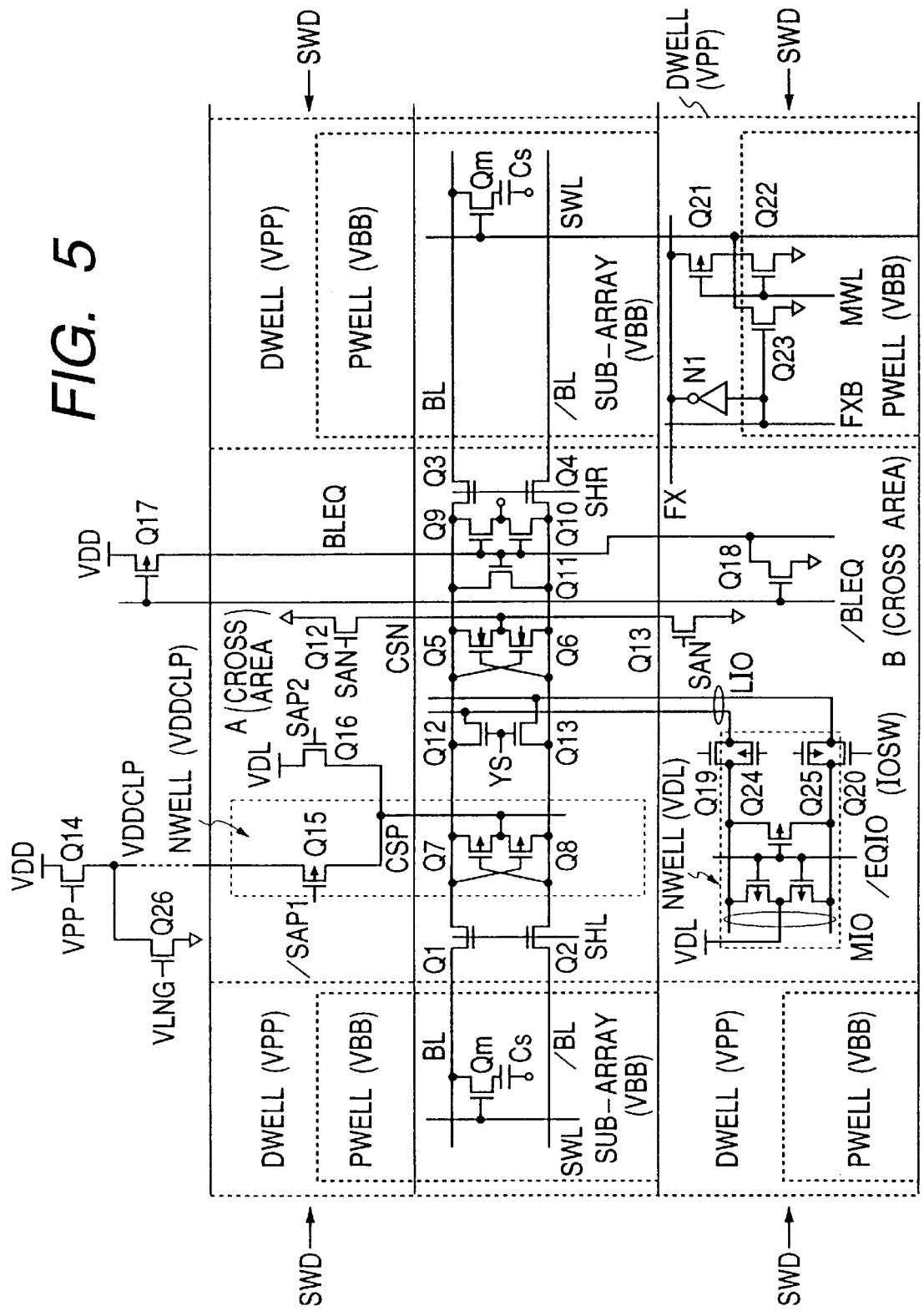
FIG. 5 is a fragmentary circuit diagram showing embodiments of a sense amplifier unit and its peripheral circuits employed in the dynamic RAM according to the present invention.

FIG. 5 is a fragmentary circuit diagram showing embodiments of a sense amplifier unit and its peripheral circuits employed in the dynamic RAM according to the present invention. Sense amplifiers placed so as to be interposed between two sub-arrays and their related circuits are illustratively shown in the drawing. Further, well regions in which respective elements or devices are formed, are indicated by dotted lines and bias voltages to be supplied to them are also shown together with the well regions.

One dynamic memory cell provided between a sub-word line SWL and one of the complementary bit lines BL and /BL placed in one sub-array referred to above is illustratively shown as a typical one. The dynamic memory cell comprises an address selection MOSFET Qm and a storage capacitor Cs. The gate of the address selection MOSFET Qm is electrically connected to the sub-word line SWL, the drain thereof is electrically connected to the bit line BL and the source thereof is electrically connected to the storage capacitor Cs. The other electrode of the storage capacitor Cs is used in common and supplied with a plate voltage. A level for selecting the sub-word line SWL is set to a high voltage VPP raised by a threshold voltage of the address selection MOSFET Qm from a high level on the bit line.

When each sense amplifier to be described later is activated by an internal deboosted or step-down voltage VDL, a high level amplified by the sense amplifier and supplied to the corresponding bit line is brought to a level corresponding to the internal voltage VDL. Thus, the high voltage VPP corresponding to the selection level for the word line is set to VDL+Vth. A pair of complementary bit lines BL and /BL placed in the sub-array provided on the left side of the sense amplifier is placed in parallel as shown in the drawing and suitably allowed to intersect as needed to maintain a capacity balance between the bit lines, for example. The complementary bit lines BL and /BL are electrically connected to their corresponding input/output nodes of a unit circuit of the sense amplifier through shared switch MOSFETs Q1 and Q2.

The unit circuit of the sense amplifier comprises N channel type amplification MOSFETs Q5 and Q6 and P channel type amplification MOSFETs Q7 and Q8 whose gates and drains are respectively cross-connected to one another so that they be brought into latch form. The sources of the N channel type MOSFETs Q5 and Q6 are electrically connected to a common source line CSN. The sources of the P channel type MOSFETs Q7 and Q8 are electrically connected to a common source line CSP. Power switch MOSFETs are respectively electrically connected the common source lines CSN and CSP. Although the invention is not restricted in particular, the common source line CSN electrically connected to the sources of the N channel type amplification MOSFETs Q5 and Q6 is supplied with an operating voltage corresponding to a ground potential by N channel type power switch MOSFETs Q12 and Q13 provided in the cross areas on the A and B sides.

An overdriving P channel type power MOSFET Q15 provided in the cross area on the A side and an N channel type power MOSFET Q16 for supplying the internal voltage VDL are electrically connected to the common source line CSP to which the sources of the P channel type amplification MOSFETs Q7 and Q8 are electrically connected. A clamp voltage VDDCLP produced by an N channel type MOSFET Q14 whose gate is supplied with the boost voltage VPP, is used as a voltage for the overdriving MOSFET. The drain of the N channel type MOSFET Q14 is supplied with a supply voltage VDD supplied from an external terminal so that the MOSFET Q14 is activated as a source follower output circuit. Thus, the N channel type MOSFET Q14 produces a clamp voltage VDDCLP reduced by a threshold voltage of the N channel type MOSFET Q14 with the boost voltage VPP as the reference.

Although the invention is not restricted in particular, the boost voltage VPP controls the operation of a charge pump circuit using a reference voltage and thereby provides a stabilized high voltage like 3.8 V. The threshold voltage of the N channel type MOSFET Q14 is brought to a threshold voltage lower than that for the address selection MOSFET Qm of the memory cell and sets the clamp voltage VDDCLP to a stabilized constant voltage like about 2.9 V. A MOSFET Q26 serves as a MOSFET for forming a leakage current path, which allows only a small current of about 1 µA to flow. Thus, this can prevent the VDDCLP from excessively rising due to a standby state (non-operating state) of the sense amplifier over a long period and a bump of the supply voltage VDD and prevent the amplification MOSFETs Q7 and Q8 supplied with the raised voltage VDDCLP from being delayed in operation due to their back bias effects.

It is noted in the present embodiment that the overdrive voltage for the sense amplifier is formed by the clamp voltage VDDCLP referred to above. The P channel type power MOSFET Q15 for supplying the overdrive voltage and the P channel type amplification MOSFETs Q7 and Q8 of the sense amplifier are formed in the same N-well region NWELL indicated by the dotted line in the same drawing. The clamp voltage VDDCLP is supplied as the bias voltage for the N-well region NWELL. The power MOSFET Q16 for supplying the original operating voltage VDL to the common source line CSP used for the P channel type amplification MOSFETs Q7 and Q8 of the sense amplifier is formed as an N channel type so as to be electrically isolated from the overdriving MOSFET Q14.

A sense amplifier activation signal SAP2 supplied to the gate of the N channel type power MOSFET Q15 is defined as a signal opposite in phase to an overdriving activation signal /SAP1 supplied to the gate of the P channel type MOSFET Q16. Although not restricted in particular, a high level of the sense amplifier activation signal SAP2 is defined as a signal corresponding to the source voltage VDD. Namely, since the VDDCLP is about +2.9 V as described above and the allowable minimum voltage VDDmin of the supply voltage VDD is about 3.0 V, the P channel type MOSFET Q15 can be brought to an off state. Further, the use of one having a low threshold voltage as the N channel type MOSFET Q16 makes it possible to output the voltage corresponding to the internal voltage VDL from the source side thereof.

A precharge circuit comprised of an equalize MOSFET Q11 for short-circuiting the complementary bit lines and switch MOSFETs Q9 and Q10 for supplying a half precharge voltage to the complementary bit lines is provided at the input/output nodes of the unit circuit of the sense amplifier. The gates of these MOSFETs Q9 through Q11 are supplied with a precharge signal BLEQ in common. In a driver circuit for forming or producing the precharge signal BLEQ, an N channel type MOSFET Q18 is provided in the cross area on the B side to make the falling edge of the precharge signal BLEQ fast. In other words, in order to increase the speed of the timing for selecting the corresponding word line with the start of a memory access, the N channel type MOSFET Q18 provided in each cross area is turned on to switch each of the MOSFETs Q9 through Q11 constituting the precharge circuit to an off state at high speed.

On the other hand, a P channel type MOSFET Q17 for forming a signal for starting a precharge operation is provided in a Y decoder & YS driver unit without being provided in each cross area as described above. Namely, this is because, since the time is allowed to perform the precharge operation, although the precharge operation is started with the completion of the memory access, it is unnecessary to make the leading edge of the signal BLEQ faster. As a result, only the overdriving power MOSFET Q15 remains as the P channel type MOSFET provided in the cross area on the A side. The P channel type MOSFETs provided in the cross area on the B side can be used as MOSFETs Q24 and Q25 constituting a switch circuit IOSW for input/output lines to be next described and MOSFETs constituting a precharge circuit for precharging a common input/output line pair MIO to the internal voltage VDL. Since these N-well regions are supplied with a bias voltage like VDDCLP or VDL, the type of N-well region results in one and hence no parasitic thyristor devices are formed.

The unit circuit of the sense amplifier is electrically connected to similar complementary bit lines BL and /BL of the right-hand sub-array through shared switch MOSFETs Q3 and Q4. The switch MOSFETs Q12 and Q13 constitute a column switch circuit and connect the input/output nodes of the unit circuit of the sense amplifier to a sub common input/output line pair LIO in response to a select signal YS. When the sub-word line SWL of the sub-array on the left side is selected, for example, the shared switch MOSFETs Q3 and Q4 on the right side of the sense amplifier are turned off. Thus, the input/output nodes of the sense amplifier are electrically connected to the complementary bit lines BL and /BL on the left side so as to amplify a small signal of the memory cell electrically connected to the selected sub-word line SWL. Thereafter, the amplified signal is supplied to the sub common input/output line pair LIO through the column switch circuit. The sub common input/output line pair LIO is electrically connected to the input/output line pair MIO connected to an input terminal of the main amplifier through the switch circuit IOSW comprised of N channel type MOSFETs Q19 and Q20 and the P channel type MOSFETs Q24 and Q25 provided in the cross area on the B side.

Figure 16:
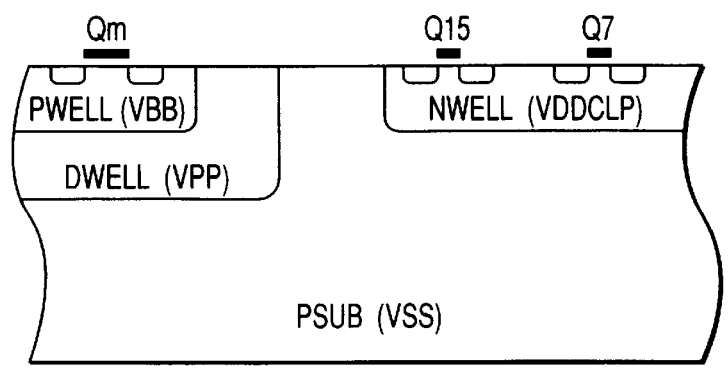
FIG. 16 is a cross-sectional view for describing the dynamic RAM according to the present invention.

As is illustratively shown, the sub-word line driver circuit SWD comprises a P channel type MOSFET Q21 formed in the deep-shaped N-well region DWELL (VPP) and N channel type MOSFETs Q22 and Q23 formed in a P-well region PWELL (VBB) formed within the region DWELL. Although the invention is not restricted in particular, an inverter circuit N1 constitutes each sub-word select line driver circuit FXD shown in FIG. 3 and is provided within the cross area as described above. The address selection MOSFET Qm of each sub-array is formed in the corresponding P-well region PWELL (VBB) formed within the region DWELL. A state in which the sources and drains of the MOSFETs Qm, Q15 and Q7 shown in FIG. 5 have been formed within a P-type semiconductor substrate PSUB, is shown in FIG. 16 in the form of a cross-sectional view.

Figure 6:
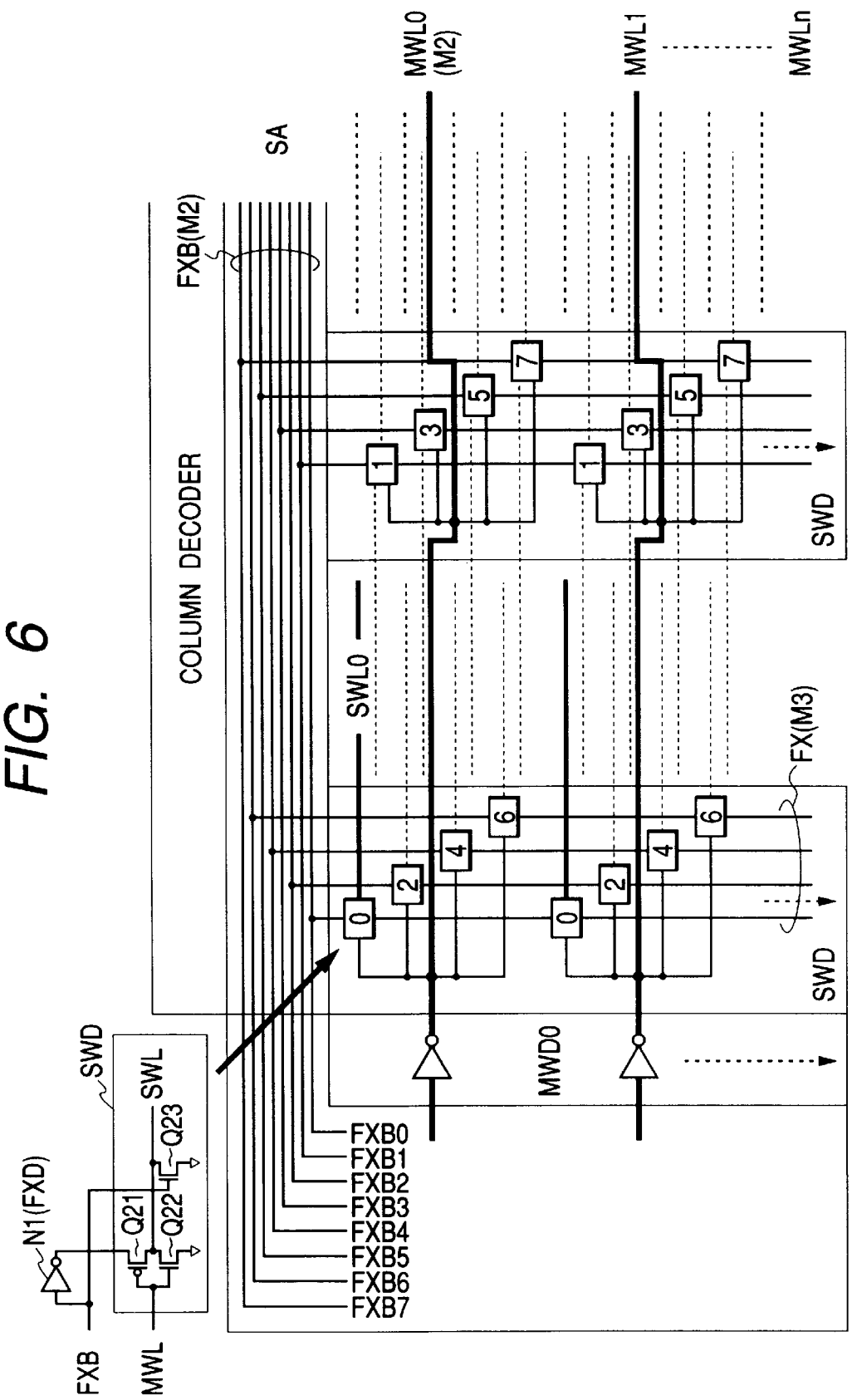
FIG. 6 is a fragmentary circuit diagram for describing the relationship between main word lines and sub-word lines of each sub-array shown in FIG. 3.

FIG. 6 is a fragmentary block diagram for explaining the relationship between main word lines and sub-word lines of the sub-array. The drawing is used to principally explain the circuit operation and collectively shows sub-word select lines FX0B through FX7B in disregard of the geometrical placement or layout of the sub-word select lines described above. In the drawing, two main word lines MWL0 and MWL1 are illustrated as typical ones to describe the selecting operation of each sub-word line. The main word line MWL0 of these is selected by a main word driver MWD0. Similarly, another main word line MWL1 is selected by a main word driver similar to the above.

Eight pairs of sub-word lines are provided for the above one main word line MWL0 along the direction of its extension. In the drawing, two sets of sub-word lines of these are illustratively shown as typical ones. Eight sub-word lines in total, which comprise those corresponding to even numbers 0 through 6 and those corresponding to odd numbers 1 through 7, are alternately placed in one sub-array. Exclusive of the even numbers 0 through 6 contiguous to each main word driver and odd numbers 1 through 7 placed on the far end side of the main word line (on the opposite side of the word driver), the sub-word driver placed between the sub-arrays drives sub-word lines of the right- and left-hand sub-arrays with the sub-word driver as the center.

Thus, since the sub-word lines corresponding to the two sub-arrays are substantially simultaneously selected by the corresponding sub-word driver SWD, as described above, although the array is divided into the eight sub-arrays as described above, the sub-arrays are substantially divided into four sets. According to the configuration in which the sub-word lines SWL are divided into the even numbers 0 through 6 and odd numbers 1 through 7 as described above and the sub-word drivers SWD are respectively placed on both sides of each memory block, the substantial pitch of each of the sub-word lines SWL placed in high density in accordance with the placement of the memory cells can be reduced twice within the sub-word driver SWD. Thus, the sub-word drivers SWD and the sub-word lines SWL can be laid out on a semiconductor chip with efficiency.

In the present embodiment, each of the sub-word drivers SWD supplies a select signal to the four sub-word lines 0 through 6 (1 through 7) in common through the corresponding main word line MWL. A sub-word select line FXB for selecting one of the four sub-word lines is provided. The sub-word select line comprises eight lines FXB0 through FXB7. Of these, the even-numbered lines FXB0 through FXB6 are provided for the sub-word drivers 0 through 6 of the even-numbered lines row, whereas the odd-numbered FXB1 through FXB7 of these are provided for the sub-word drivers 1 through 7 of the odd-numbered row.

The sub-word select lines FXB0 through FXB7 are formed on each sub-array by a metal wired layer M2 corresponding to a second layer and consist of first sub-word select lines extended parallel to the main word lines MWL0 through MWLn formed by the metal wired layer M2 in the same manner as described above, and second sub-word select lines extending in the direction orthogonal to the first sub-word select lines. Since the second sub-word select lines intersect the main word lines MWL, although the invention is not restricted in particular, they are formed by a metal wired layer M3 corresponding to a third layer.

As one of the sub-word drivers SWD is shown by way of illustrative example, the sub-word driver SWD comprises a first CMOS inverter circuit comprised of a P channel type MOSFET Q21 and an N channel type MOSFET Q22 whose input terminals are electrically connected to their corresponding main word line MWL and whose output terminals are electrically connected to their corresponding sub-word line SWL, and a switch MOSFET Q23 which is provided between the sub-word line SWL and the circuit ground potential and receives the sub-word select signal FXB therein. Although the eight sub-word select lines in total comprised of FX and FXB are actually arranged along the sub-word driver row of 0, 2, 4 and 6 to connect the gates of the switch MOSFETs Q23, only one sub-word line is shown in the drawing.

A second CMOS inverter circuit N1 for forming or producing the reverse signal FX of the sub-word select signal FXB is provided as each sub-word select line driver circuit FXD whose output signal is supplied to a source terminal of the P channel type MOSFET Q21, which serves as an operating voltage terminal of the first CMOS inverter circuit. Although the invention is not restricted in particular, the second CMOS inverter circuit N1 is formed in each cross area as shown in FIG. 3 and is used in common with a plurality of sub-word drivers SWD (64 sub-word drivers in the aforementioned embodiment).

When the main word line MWL is at a high level like a boost voltage VPP corresponding to a word line selection level in the configuration of the aforementioned sub-word driver SWD, the N channel type MOSFET Q22 of the first CMOS inverter circuit is turned on so that the corresponding sub-word line SWL is brought to a low level like the circuit ground potential. Even if, at this time, the sub-word select signal FXB is brought to a selection level corresponding to the low level like the circuit ground potential and the output signal of the second CMOS inverter circuit N1 provided as the sub-word select line driver circuit FXD is brought to the selection level corresponding to the boost voltage VPP, the P channel type MOSFET Q21 is in an off state in response to the non-selection level of the main word line MWL. Therefore, the sub-word line SWL is brought to a non-selected state due to the turning on of the N channel type MOSFET Q22.

When the main word line MWL is at the low level like the circuit ground potential corresponding to the selection level, the N channel type MOSFET Q22 of the first CMOS inverter circuit is turned off so that the P channel MOSFET Q21 is turned on. If the sub-word select signal FXB is at the low level like the circuit ground potential at this time, then the output signal of the second CMOS inverter circuit N1 serving as the sub-word select line driver circuit FXD is brought to the selection level corresponding to the boost voltage VPP so that the sub-word line SWL is set to the selection level like VPP. If the sub-word select signal FXB is of the non-selection level like the boost voltage VPP, then the output signal of the second CMOS inverter circuit N2 is rendered low in level. With its transition, the N channel type MOSFET Q23 is turned on so that the sub-word line SWL is brought to a non-selection level corresponding to the low level.

The main word line MWL and the first sub-word select line FXB placed parallel thereto are maintained at non-selection levels both brought to the high level like VPP as described above. Therefore, even if an insulation failure occurs between the parallel-arranged main word line MWL and the first sub-word select line FXB when a RAM is in a non-selected (standby) state, no leakage current flows. As a result, the first sub-word select line FXB can be formed between the main word lines MWL and placed on each sub-array. Further, a failure in the direct current due to the leakage current can be avoided, so that the densification of a layout results in high reliability.

Figure 7:
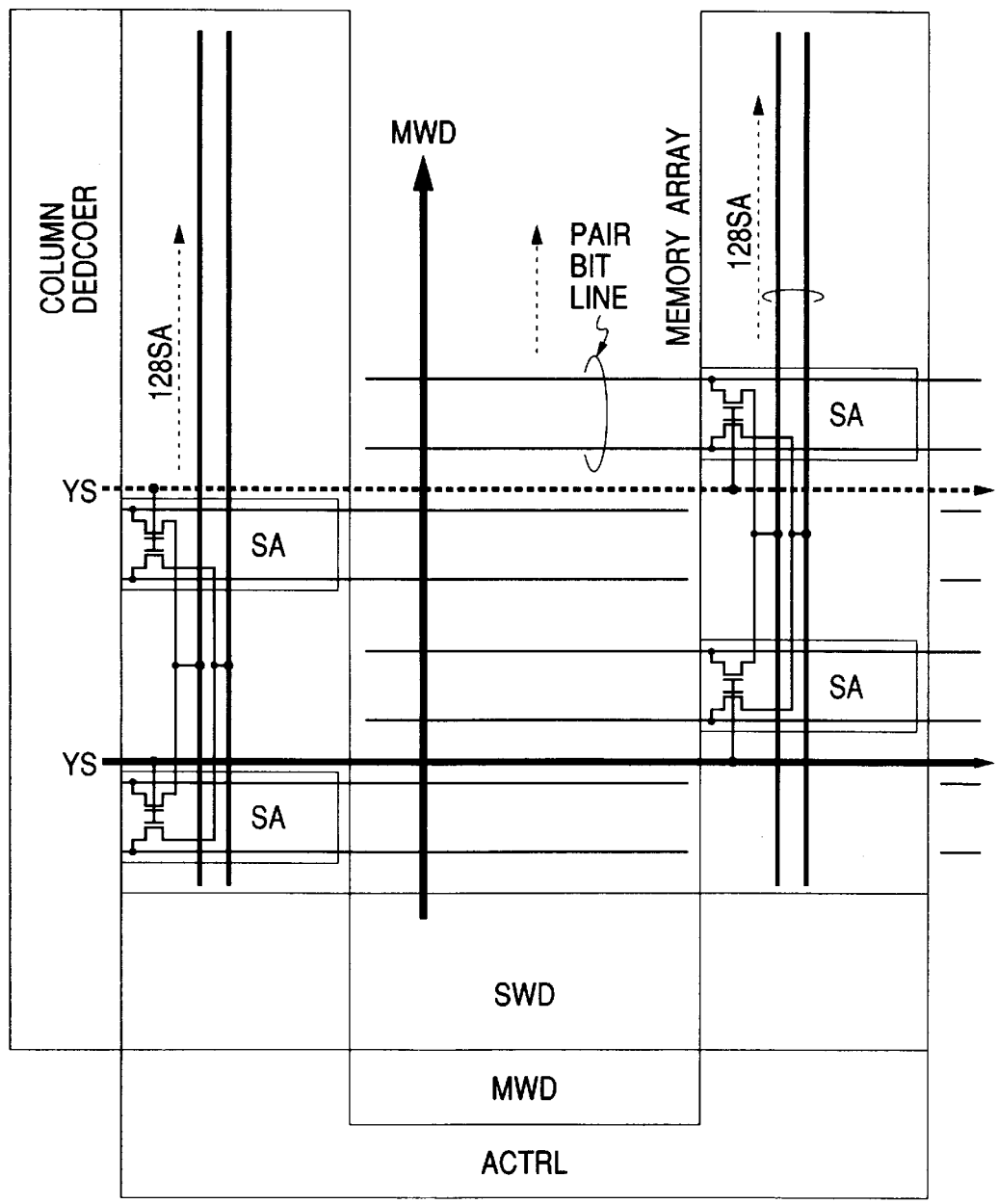
FIG. 7 is a fragmentary circuit diagram for describing the relationship between the main word line and sense amplifiers of each sub-array shown in FIG. 3.

FIG. 7 is a fragmentary block diagram for describing the relationship between the main word line and sense amplifiers of the memory array. In the drawing, one main word line MWL is shown as a typical one. The main word line MWL is selected by its corresponding main word driver MWD. A sub-word driver SWD corresponding to the even-numbered sub-word lines is provided adjacent to the main word driver MWD.

Although omitted in the drawing, complementary bit lines (Pair Bit Line) are provided so as to intersect sub-word lines placed parallel to the main word line MWL. Although not restricted in particular in the present embodiment, the complementary bit lines are also divided into an even-numbered row and an odd-numbered row. Sense amplifiers SA are distributed to the left and right sides with the sub-array (memory cell array) as the center so as to correspond to the divided complementary bit lines. The sense amplifiers SA are configured as the shared sense system as described above. However, the respective sense amplifiers SA at the ends are substantially provided with the complementary bit lines on one side alone, but are electrically connected to their corresponding complementary bit lines through shared switch MOSFETs.

Since the complementary bit lines are distributed to the odd-numbered row and even-numbered row in the configuration in which the sense amplifiers SA are placed on both sides of each memory block in distributed form as described above, the sense amplifier row can be reduced in pitch. If described reversely, device areas for forming the sense amplifiers SA can be ensured while the complementary bit lines are being placed at a high density. The sub input/output lines are respectively placed along the arrangements of the sense amplifiers SA. The sub input/output lines are electrically connected to their corresponding complementary bit lines through column switches. Each of the column switches comprises a switch MOSFET. The gate of each switch MOSFET is electrically connected to a column select line YS to which a select signal outputted from a column decoder COLUMN DECODER is transmitted.

Figure 8:
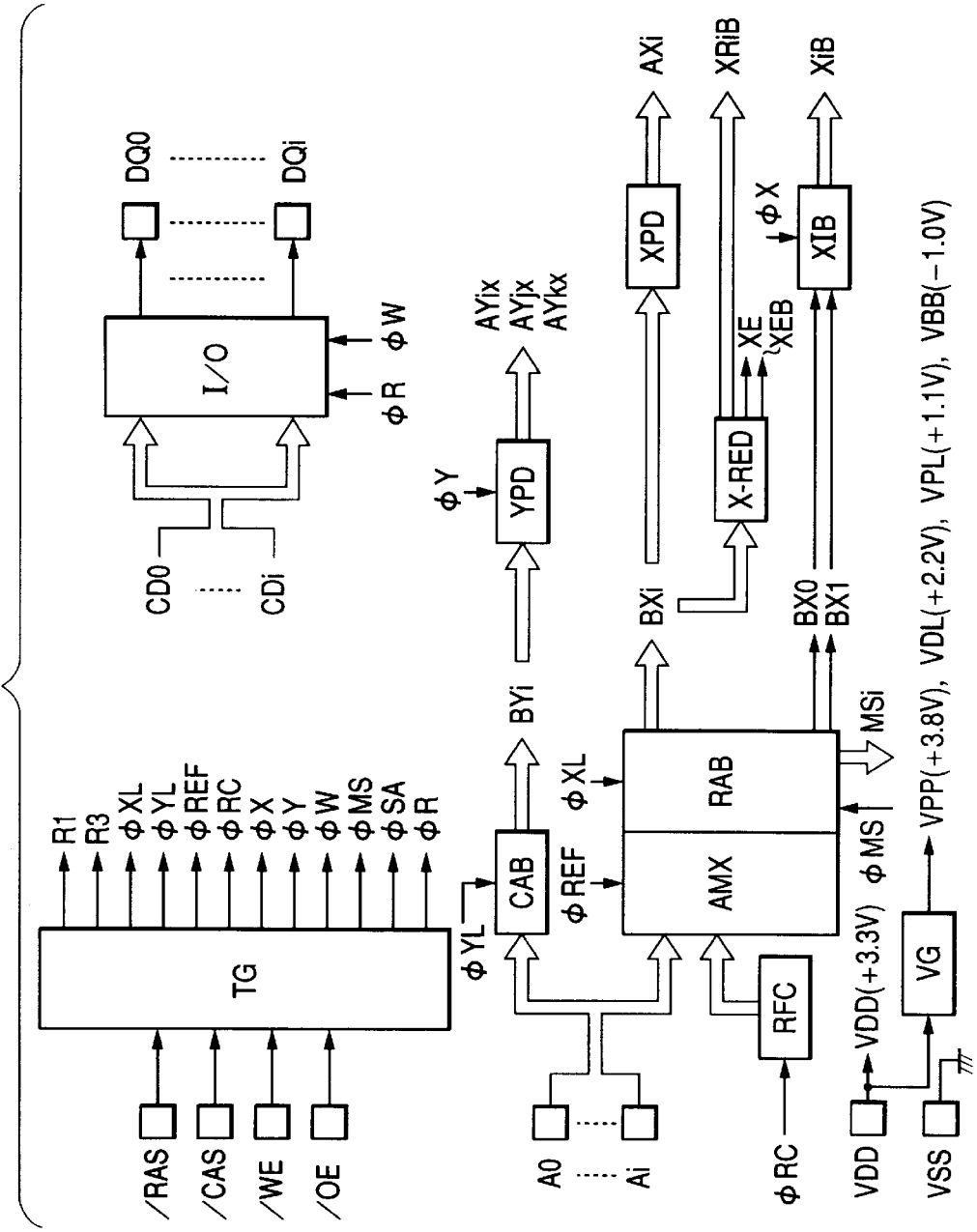
FIG. 8 is a schematic block diagram showing a peripheral circuit portion of the dynamic RAM according to the present invention.

FIG. 8 is a schematic block diagram showing one embodiment of a peripheral circuit portion or unit of the dynamic RAM according to the present invention. A timing control circuit TG determines an operation mode in response to a row address strobe signal /RAS, a column address strobe signal /CAS, a write enable signal /WE and an output enable signal /OE supplied from external terminals and correspondingly forms various timing signals necessary for the operations of internal circuits. In the present specification and the accompanying drawings, / means that a low level indicates an active level.

Signals R1 and R3 indicate internal timing signals for a row system, respectively and are used to perform a row-system selecting operation. A timing signal φXL indicates a signal for taking in or capturing row-system addresses and for allowing their retention and is supplied to a row address buffer RAB. Namely, the row address buffer RAB takes in or captures addresses inputted from address terminals A0 through Ai in response to the timing signal φXL and causes a latch circuit to retain them therein. A timing signal φYL indicates a signal for capturing column-system addresses and for allowing their retention and is supplied to a column address buffer CAB. Namely, the column address buffer RAB captures the addresses inputted from the address terminals A0 through Ai in response to the timing signal φYL and causes a latch circuit to hold them therein.

A signal φREF is a signal generated upon a refresh mode and is supplied to a multiplexer AMX connected to an input portion of the row address buffer RAB. Upon the refresh mode, the signal φREF controls the multiplexer AMX so that the multiplexer AMX selects a refresh address signal produced by a refresh address counter circuit RFC. The refresh address counter circuit RFC counts a refresh stepping pulse φRC produced by the timing control circuit TG to thereby generate a refresh address signal. There are provided auto-refresh and self-refresh to be described later in the present embodiment. A timing signal φx indicates a word line selection timing signal, which is supplied to a decoder XIB from which four types of word line selection timing signals XiB are created based on signals obtained by decoding address signals corresponding to the two rightmost bits. A timing signal φY indicates a column selection timing signal, which is supplied to a column system predecoder YPD from which column select signals AYix, AYjx and AYkx are outputted.

A timing signal φW is a control signal for specifying a write operation. A timing signal φR is a control signal for specifying a read operation. These timing signals φW and φR are supplied to an input/output circuit I/O and serve to activate an input buffer included in the input/output circuit I/O and bring an output buffer to an output high impedance state upon the write operation. On the other hand, when the read operation is performed, the output buffer is activated and the input buffer is brought to the output high impedance state. Although the invention is not restricted in particular, a timing signal φMS indicates a signal for specifying a memory array selecting operation and is supplied to the row address buffer RAB from which a select signal MSi is outputted in synchronism with this timing. A timing signal φSA is a signal for specifying the operation of each sense amplifier. A pulse for activating the sense amplifier is produced based on the timing signal φSA.

In the present embodiment, a row-system redundant circuit X-RED is illustratively shown as a typical one. Namely, the redundant circuit X-RED includes a memory or storage circuit for storing a faulty address therein and an address comparison circuit. The stored faulty address is compared with an internal address signal BXi outputted from the row address buffer RAB. When they mismatch with each other, the circuit X-RED renders a signal XE high in level and brings a signal XEB to a low level, thereby enabling or making the operation of a normal circuit effective. If it is found that the input internal address signal BXi and the stored faulty address have coincided with each other, then the circuit X-RED brings the signal XE to the low level and prohibits the normal circuit from selecting a faulty main word line. Further, the circuit X-RED renders the signal XEB high in level and outputs a select signal XRiB for selecting one spare main word line.

An internal voltage generator VG receives a supply voltage VDD like 3.3 V and a ground potential VSS of 0 V supplied from external terminals and produces the boost voltage VPP (+3.8 V), an internal voltage VDL (+2.2 V), a plate voltage (precharge voltage) VPL (1.1 V) and a substrate voltage VBB (−1.0 V). Although the invention is not restricted in particular, the boost voltage VPP and substrate voltage VBB serve to stably form or produce the above-described voltages VPP and VBB using a charge pump circuit and its control circuit. The internal voltage VDL is produced by internally reducing the supply voltage VDD using the reference voltage and stabilizing the resultant voltage. The plate voltage VPL and half precharge voltage are produced by dividing the internal deboosted or step-down voltage VDL in half.

Figure 9:
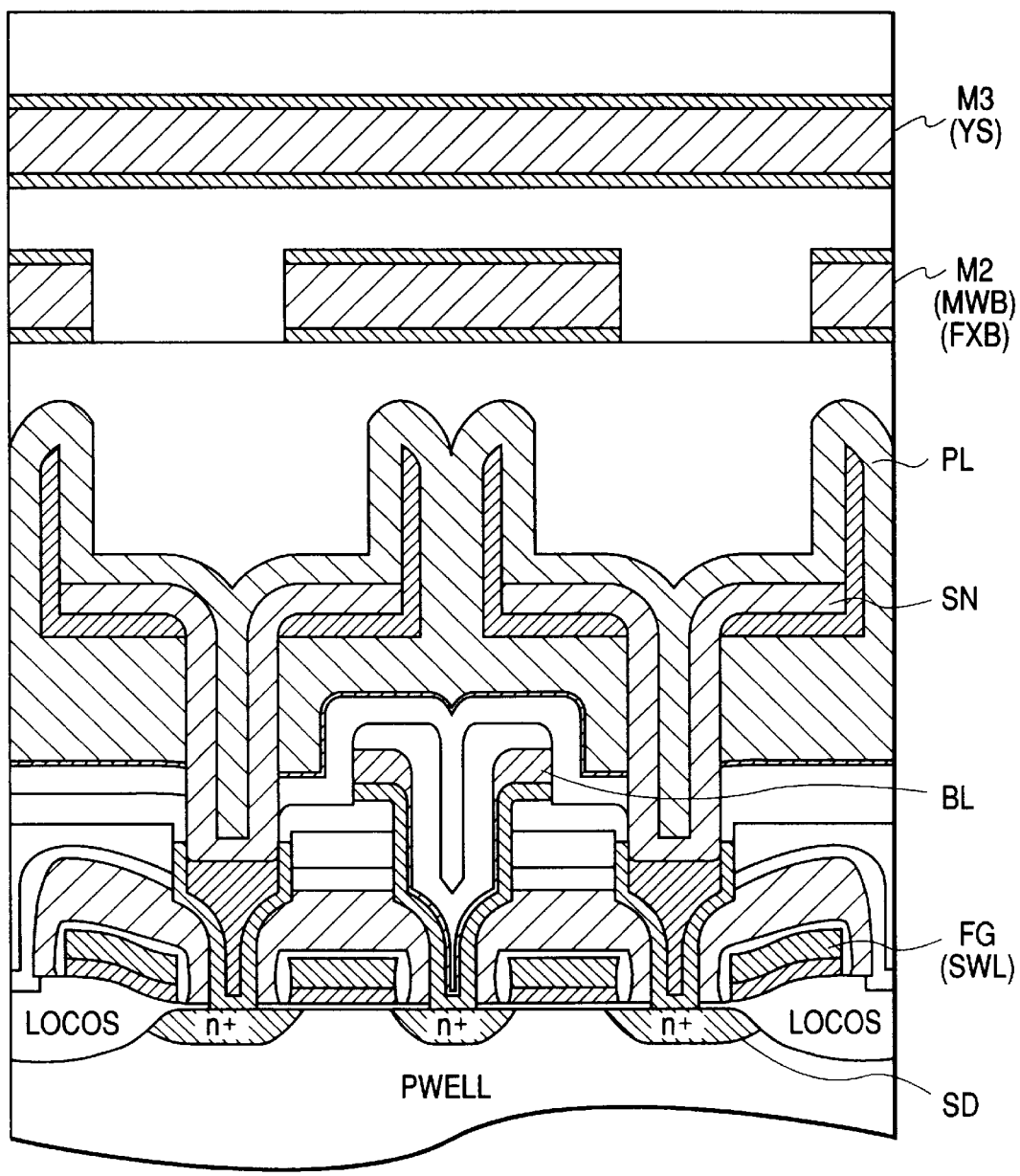
FIG. 9 is a cross-sectional view of a memory cell portion for describing the dynamic RAM according to the present invention.

FIG. 9 is a device structure cross-sectional view for describing the dynamic RAM according to the present invention. In the present embodiment, the device structure of the memory cell unit referred to above is illustratively shown as a typical one. With respect to a storage capacitor of each memory cell, a polysilicon layer corresponding to a second layer is used as a storage node SN and is electrically connected to a source and drain SD of one address selection MOSFET. The storage node SN comprised of the polysilicon layer used as the second layer takes a crown structure in which a plate electrode PL comprised of a polysilicon layer used as a third layer is formed with a thin gate insulating film interposed therebetween. The gate of the address selection MOSFET is formed integrally with a sub-word line SWL and is formed by a polysilicon layer used as a first layer and tungsten silicide (WSi) formed on its upper portion. The source and drain of the other address selection MOSFET are electrically connected to a bit line BL formed by a polysilicon layer and tungsten silicide provided on its upper portion, similar to the above. A main word line MWB and a sub-word select line FXB comprised of a metal-layer M2 corresponding to a second layer are formed in a portion above the memory cell. Further, a Y select line YS and a sub-word select line FX comprised of a metal layer M3 corresponding to a third layer are formed in a portion above the metal layer M2.

Although omitted in drawing, N and P channel type MOSFETs constituting a sub-word driver SWD and the like are formed around the memory cell unit. Although not shown in the drawing, a metal layer corresponding to a first layer is formed to constitute these peripheral circuits. The metal layer M1 corresponding to the first layer is used as a wire or interconnection for electrically connecting the gates of the N channel type MOSFET and P channel type MOSFET to constitute the above-described CMOS inverter circuit, for example. A connection between an input terminal of the CMOS inverter circuit and the main word line MWB comprised of the metal layer M2 used as the second layer is led to the metal layer M1 used as a dummy via a through hole and is electrically connected to a gate electrode through the wired layer M1 used as the first layer and a contact.

When the Y select line YS formed by the metal layer M3 used as the third layer is electrically connected to the gate of a column selection switch MOSFET or when the sub-word line select line FX formed by the metal layer M3 is electrically connected to the source and drain of the P channel type MOSFET for the sub-word driver, the Y select line YS or the sub-word line select line FX is led to the metal layers M2 and M1 each used as the dummy via the through hole and is electrically connected to the gate of the column switch MOSFET and the source and drain of the P channel type MOSFET.

When such a device structure as described in the present embodiment is adopted, a non-negligible leakage current flows due to a failure produced in an insulating film formed between the metal layer M2 used as the second layer for constituting the main word line as described above and the sub-word select line comprised of a portion of the metal layer M2 used as the second layer, which extends parallel to the metal layer M2 or a portion of the metal layer M3 used as the third layer intersecting the metal layer M2 for the main word line. Although such a leakage current itself actually shows no problem because it has no effect on the read/write operation of each memory cell, it could cause a current-failure problem in a word-line non-selected state. In the present embodiment, the leakage current will not be produced because the main word line MWB and the sub-word select line FXB are identical in potential to each other and are placed in the non-selected state.

When a failure occurs in the read/write operation of each memory cell due to the occurrence of the leakage current between the main word line MWB and the sub-word select line FXB, the main word line MWB is replaced by a spare main word line. However, the faulty main word line MWB remains as it is and thereby the leakage current keeps flowing through the main word line MWB. As a result of the replacement of the faulty main word line MWB with the spare main word line, the occurrence of the leakage current referred to above has no effect on the read and write operations of each memory. However, the direct current increases and hence the memory is subject to deterioration of its performance as a product. Since the direct current is rendered faulty at the worst, the defect relief or saving circuit is not put to practical use. However, the adoption of the above-described configuration can avoid such a problem.

When the stabilized voltages VDDCLP and VDL independent of the supply voltage VDD are used as the operating voltage of the sense amplifier as in the aforementioned embodiment, the amplifying operation of the sense amplifier can be stably performed without depending on the supply voltage VDD. However, when one used for a delay circuit for forming or producing an activation signal of the sense amplifier or forming a column select timing signal following the amplifying operation of the sense amplifier is configured using the supply voltage VDD, the stabilization of the amplifying operation of the sense amplifier has been found to turn into a problem in reverse.

Figure 15:
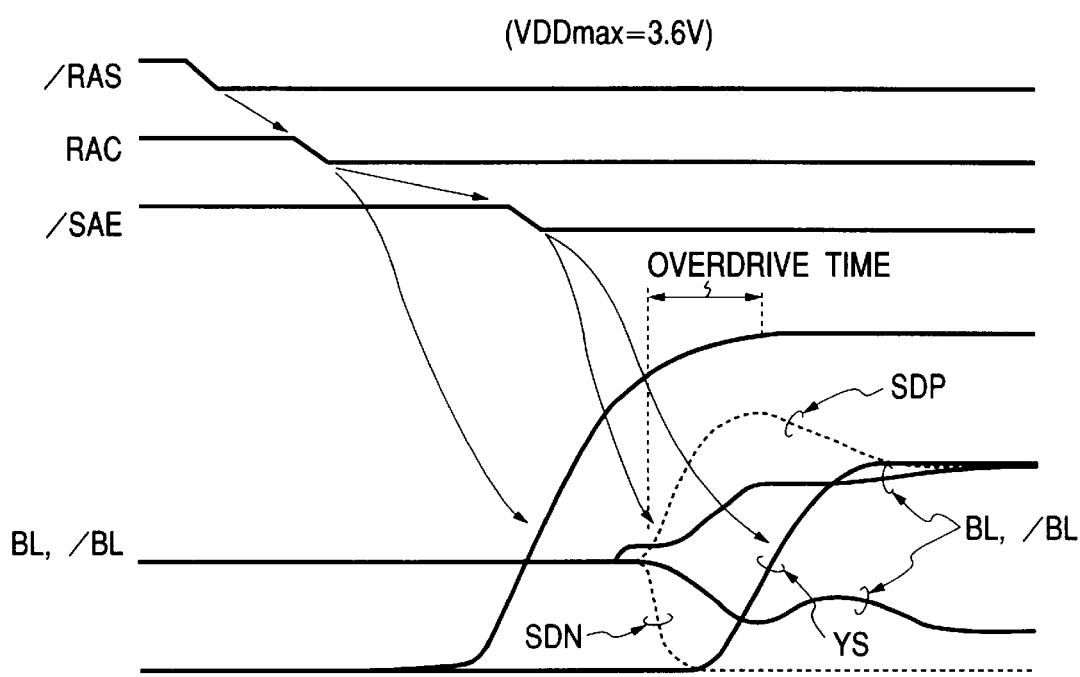
FIG. 15 is a waveform diagram for describing the operation of a dynamic RAM discussed prior to the present invention.

If the supply voltage VDD rises as the allowable maximum value VDDmax=3.6 V as shown in a waveform diagram of FIG. 15, then a current flowing in the delay circuit increases correspondingly and hence the signal propagation delay time becomes short. Therefore, the overdrive time becomes short and hence the amplifying speed of the bit lines BL and /BL is delayed. In addition to this, the rise timing of the column select signal YS becomes fast according to the reduction in delay time. Thus, the amplification amplitude is reduced by connecting the input/output nodes of the sense amplifier to the sub common input/output line pair LIO prior to an amplifying signal of each sense amplifier becoming sufficiently large.

Described specifically, a bit line potential on the low level side is raised by precharging the sub common input/output line pair LIO to the high level corresponding to the internal voltage VDL. At worst, the bit line potential becomes equal to the high level of the sense amplifier referred to above, thus leading to reverse reading. It is thus necessary to set the timing provided to operate each circuit assuming that the above-described delay circuit depends on the supply voltage as the worst case. As a result, a problem arises in that the operating speed becomes slow.

Figure 10:
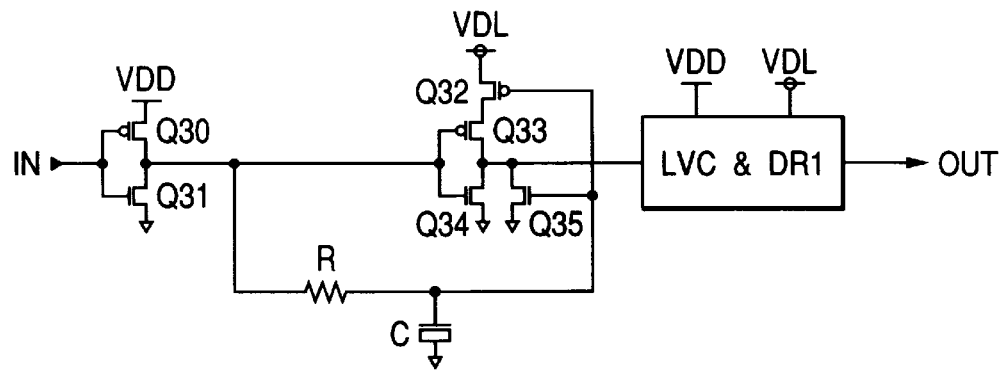
FIG. 10 is a circuit diagram illustrating one embodiment of a delay circuit employed in the dynamic RAM according to the present invention.

FIG. 10 is a circuit diagram showing one embodiment of a delay circuit employed in the dynamic RAM according to the present invention. In the present embodiment, the amplitude of a delayed signal is rendered constant without depending on a supply voltage VDD by a CMOS inverter circuit comprised of a P channel type MOSFET Q30 and an N channel type MOSFET Q31 each activated by an internal voltage VDL. Further, a NOR gate circuit comprised of P channel type MOSFETs Q32 and Q33 and N channel type MOSFETs Q34 and Q35, which receive a delayed signal produced from a delay circuit comprised of a resistor R and a capacitor C, is also activated by the internal voltage VDL. In this construction, a predetermined delay time interval can be set without reference to a variation in supply voltage VDD.

Namely, when an input signal IN is low in level, the P channel type MOSFET Q30 is turned on to form or produce a high level corresponding to the internal voltage VDL. As a result, the N channel type MOSFETs Q34 and Q35 of the NOR gate circuit are turned on to form an output signal low in level. This signal is converted from a VDL level signal to a VDD level signal by a level converter LVC and a driver circuit DR1 from which the converted signal is outputted. When the input signal IN is changed from the low to high levels, the P channel type MOSFET Q30 is turned off and the N channel type MOSFET Q31 is turned on, so that the N channel type MOSFET Q34 is turned off and the P channel type MOSFET Q33 is turned on.

However, the VDL held in the capacitor C is discharged through the high level resistor R corresponding to VDL and the output signal of the NOR gate circuit remains at the low level during a period in which the stored VDL reaches a logic threshold voltage or less of the NOR gate circuit. When the potential of the capacitor C reaches less than or equal to the logic threshold voltage, the output signal of the NOR gate circuit rises from the low to high levels. Namely, if the time delay set to the level converter and driver circuit is ignored in the output signal OUT upon the rise of the input signal IN from the low to high levels, the delay time set by the resistor R and the capacitor C is raised to a high level after its elapse.

If such a delay circuit is used so as to set, for example, a timing signal for selecting a word line as the input signal and produce a sense amplifier activation signal from the above output signal, then the word line and its corresponding sense amplifier can be operated at substantially predetermined time intervals without reference to the variation in supply voltage VDD. If the activation signal for the sense amplifier is defined as the input signal and the column select signal YS is produced based on its delayed signal, then the word line and sense amplifier can be activated without being subjected to the variation in supply voltage VDD. The column select signal YS is placed under the conditions that a column address strobe signal /CAS is low in level, a column address signal is captured and a column decoder is activated to form a select signal. It is needless to say that the input signal IN supplied to the delay circuit includes the above-described conditions.

Figure 11:
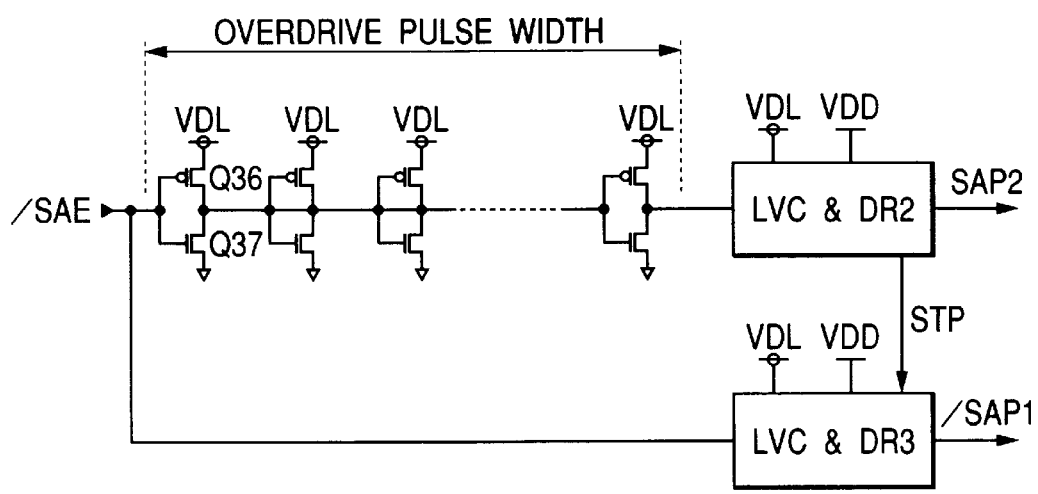
FIG. 11 is a circuit diagram depicting a pulse generator for generating an overdrive pulse employed in the dynamic RAM according to the present invention.

FIG. 11 is a circuit diagram showing one embodiment of a pulse generator for generating an overdrive pulse. Even in the present embodiment, a CMOS inverter circuit, which constitutes a delay circuit, makes use of an internal voltage VDL as an operating voltage as in the case of a CMOS inverter circuit shown by a P channel type MOSFET Q36 and an N channel type MOSFET Q37 to avoid the influence of a variation in supply voltage VDD on the width of the overdrive pulse. This type of CMOS inverter circuit is electrically connected in plural stages in the form of a vertical row to obtain delay times corresponding to the pulse widths required.

An unillustrated input circuit for producing a sense amplifier activation signal /SAE is also activated by the internal voltage VDL so that a timing signal /SAP1 changed from a high to a low levels according to a change to a low level of the sense amplifier activation signal /SAE can be produced. Further, a stop signal STP is produced after the elapse of a delay time by each delay circuit referred to above to thereby change the timing signal /SAP1 from the low to high levels, whereby the overdriving P channel type MOSFET Q15 is turned off. Next, a sense amplifier activation signal SAP2 is changed to a high level to turn on the N channel type power MOSFET Q16.

Using the supply voltage VDD, the high level for turning off the P channel type MOSFET Q15 is formed or produced and the high level for turning on the N channel type MOSFET Q16 is formed in the present embodiment. Therefore, the N channel type MOSFET Q16 is set so as to have a threshold voltage lower than that of the address selection MOSFET of the memory cell referred to above to supply the internal voltage VDL to the common source line CSP as it is.

Even in this embodiment, since the overdrive time is set using each delay circuit like the CMOS inverter circuit activated by the internal voltage VDL, the sense amplifier can be activated without reference to the variation in supply voltage VDD. As a result, the overdrive voltage of the sense amplifier can stably work through the clamp voltage VDDCLP and the internal voltage VDL and hence the amplifying operation of the sense amplifier will act synergistically with the stable working to allow its stabilization. Namely, since the substrate voltage of the amplification MOSFET is stabilize d with the VDDCLP as described above, the threshold voltage can be prevented from increasing due to the substrate effect of the P channel type amplification MOSFET even if the supply voltage VDD rises, and the amplification of the sense amplifier under stable gain can be performed. Further, a timing margin can be set to the required minimum because there is no variation in operation timing due to the variation in supply voltage VDD. As a result, a speeding up of the access time to the memory can be expected.

Figure 12:
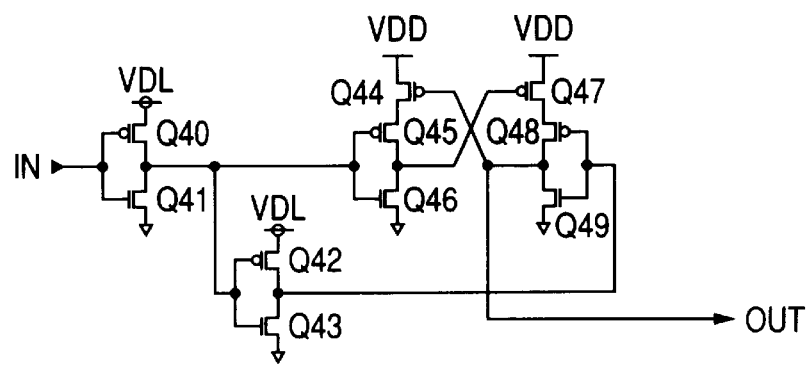
FIG. 12 is a circuit diagram showing one embodiment of a level converter employed in the dynamic RAM according to the present invention.

FIG. 12 is a circuit diagram showing one embodiment of a level converter LVC employed in the timing generator. An input signal IN to be by-level converted is inverted by a CMOS inverter circuit comprised of a P channel type MOSFET Q40 and an N channel type MOSFET Q41. Further, the so-processed signal is inverted by a CMOS inverter circuit comprised of a P channel type MOSFET Q42 and an N channel type MOSFET Q43. Therefore, the signals outputted from the two CMOS inverter circuits are signals opposite in phase to each other.

The VDL level signals having opposite phases are supplied to the gates of a P channel type MOSFET Q45 and an N channel type MOSFET Q46 and the gates of a P channel type MOSFET Q48 and an N channel type MOSFET Q49, respectively. P channel MOSFETs Q44 and Q47 are provided between the sources of the P channel type MOSFETs Q45 and Q48 and a supply voltage VDD. The gates of the P channel type MOSFETs Q44 and Q47 are supplied with other output signals with the signals intersecting each other so that an output signal OUT corresponding to the supply voltage VDD is outputted from the drains of the MOSFETs Q48 and Q49.

When the gates of the MOSFETs Q45 and Q46 are high in level (VDL) and the gates of the MOSFETs Q48 and Q49 are low in level (VSS), the P channel type MOSFET Q47 of the other circuit is turned on by the turning on of the MOSFET Q46. Thus, a high level like the supply voltage VDD is outputted through the MOSFETs Q47 and Q48 so that the P channel type MOSFET Q44 is turned off. Reversely when the gates of the MOSFETs Q45 and Q46 are low in level (VSS) and the gates of the MOSFETs Q48 and Q49 are high in level (VDL), a low level is outputted by the turning on of the MOSFET Q49 so that the P channel type MOSFET Q44 of the other circuit is turned on. Thus, the high level like the supply voltage VDD is outputted through the MOSFETs Q44 and Q45 so that the P channel type MOSFET Q47 is turned off.

Figure 13A:
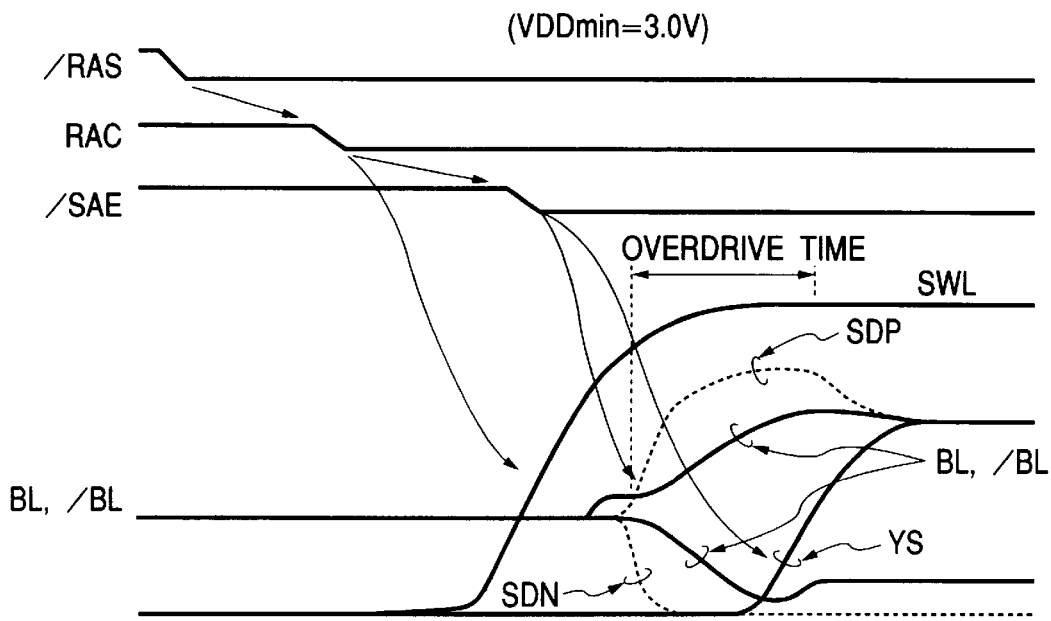
FIGS. 13A and 13B are waveform diagrams for describing one example of the operation of the dynamic RAM according to the present invention.
Figure 13B:
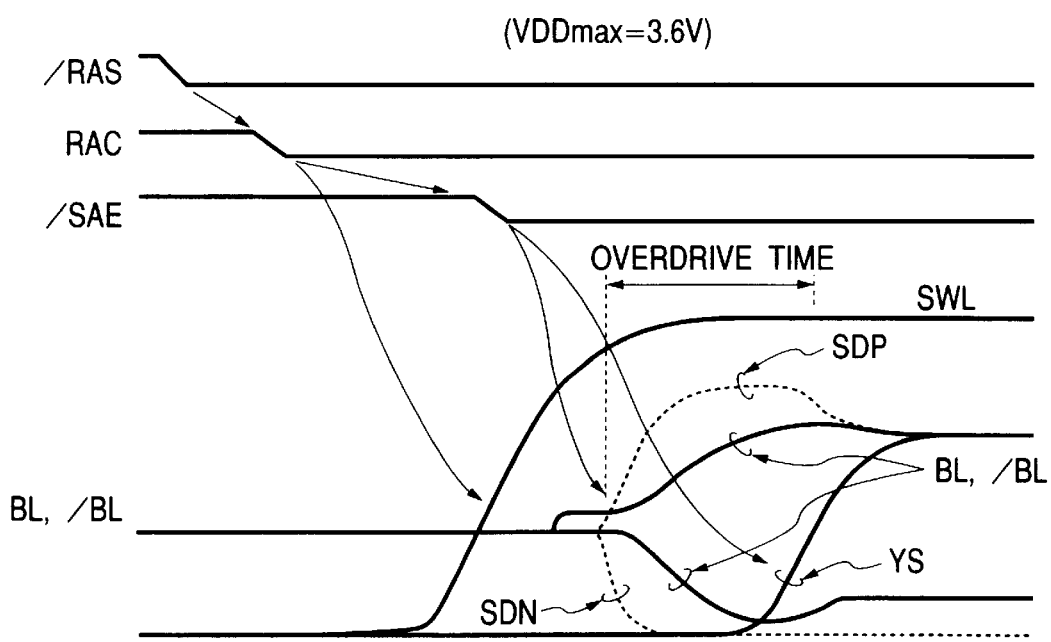

FIGS. 13A and 13B are timing diagrams for describing one example of the operation of the dynamic RAM according to the present invention. FIG. 13A shows a case in which a supply voltage VDD is low like the allowable minimum voltage VDDmin=3.0 V. A row-system memory access is started in accordance with a low level of /RAS and hence a row-address system selection timing signal RAC is generated, so that a corresponding word line SWL is selected. The signal RAC is delayed by the delay circuit shown in FIG. 10 to thereby produce a sense amplifier activation signal /SAE. The sense amplifier activation signal /SAE is supplied to the t iming generator shown in FIG. 11 where an overdrive pulse and a sense amplifier activation signal are produced. Thus, the potential at the common source line CSP is raised to above an i nternal voltage VDL by an overdrive time interval, so that the rise to a high level of a bit line BL or /BL can be speeded up. Thereafter, the sense amplifier activation signal /SAE is delayed by the delay circuit shown in FIG. 10 to allow a Y select signal YS to rise.

FIG. 13B illustrates a case in which the supply voltage VDD is high, such as the allowable maximum voltage VDDmax=3.6 V. A timing pulse is generated by the delay circuit independent on the supply voltage VDD as described above and the threshold voltage of an amplification MOSFET of a sense amplifier stably works because it does not vary according to the variation in supply voltage VDD, whereby the matching of the threshold voltage with an overdrive time is maintained. Therefore, the threshold voltage stably works as designed even if the supply voltage VDD changes from the allowable minimum voltage to the allowable maximum voltage. Thus, since the necessity for setting a special timing margin can be eliminated, a memory access can be speeded up.

Figure 14:
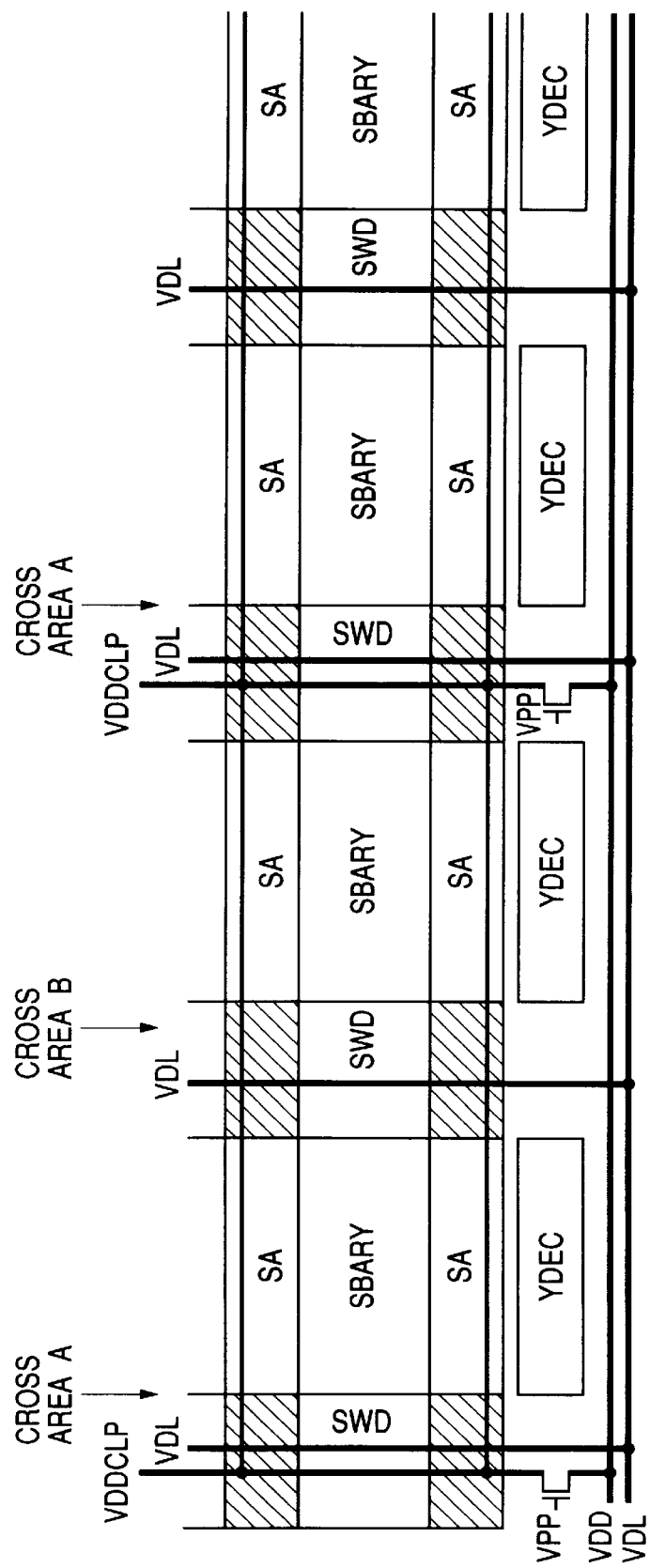
FIG. 14 is a schematic layout diagram for describing power supply wires employed in the dynamic RAM according to the present invention.

FIG. 14 is a schematic layout diagram for describing power supply lines or wires employed in the dynamic RAM according to the present invention. In the present embodiment, each of MOSFETs for forming clamp voltages VDDCLP is placed between adjacent Y decoders YDEC. Since the overdriving P channel type MOSFETs are formed in cross areas in A rows, the N channel type MOSFETs for the voltage clamping are placed correspondingly. Although the invention is not restricted in particular, short-circuiting wires or interconnections are formed along sense amplifier rows respectively. Thus, a contrivance for reducing the source impedance of VDDCLP has been made. Further, internal deboosted or step-down voltages VDL are respectively provided so as to extend along the cross areas of the A and B rows. Each internal step-down voltage VDL is supplied to a common source line CSP through the N channel type power switch MOSFET and also is utilized as a precharge voltage for a common input/output line pair MIO.

Operations and effects obtained from the aforementioned embodiments are as follows:

(1) An advantageous effect can be obtained in that an N channel type voltage clamp MOSFET, whose drain and gate are respectively supplied with a supply voltage supplied from an external terminal and a boosted constant voltage and whose source outputs a constant voltage, is provided and the clamp voltage outputted from the source of the voltage clamp MOSFET is supplied, as a sense amplifier operating voltage, to a common source line for P channel type amplification MOSFETs constituting a sense amplifier through a P channel type first power MOSFET switch-controlled by a sense amplifier activation signal, and the constant voltage outputted from the source of the voltage clamp MOSFET is supplied to an N-well region for forming the P channel type first power MOSFET and the P channel type MOSFETs constituting the sense amplifier as a bias voltage, whereby the amplifying operation of the sense amplifier can be stabilized without being affected by a variation in source or supply voltage.

(2) Another advantageous effect can be obtained in that an N channel type third power MOSFET, whose gate and drain are respectively supplied with a sense amplifier activation signal and a regulated internal voltage and whose source outputs an operating voltage to be supplied to the first common source line, is further provided, and the constant voltage outputted from the source of the voltage clamp MOSFET is defined as an overdrive voltage set to a voltage higher than the operating voltage supplied from the N channel type third power MOSFET, and the sense amplifier activation signal supplied to the gate of the first power MOSFET is defined as an overdrive activation signal, whereby the sense amplifier can be speeded up and stabilized in operation.

(3) A further advantageous effect can be obtained in that since the third power MOSFET and the first power MOSFET are formed using the sense amplifier activation signal supplied to the gate of the third power MOSFET and the activation signal supplied to the gate of the first power MOSFET for supplying the overdrive voltage and similarly using the supply voltage VDD supplied from the external terminal, these MOSFETs can be switch-controlled and the driver circuits can be simplified.

(4) A still further advantageous effect can be obtained in that P channel type switch MOSFETs constituting a selection switch circuit provided between a sub common input/ output line pair provided in association with each sub-array referred to above and connected to each selected one of the complementary bit line pairs through a column switch and a common input/output line pair connected with a main amplifier, a P channel type precharge MOSFET for supplying the internal voltage to the common input/output line pair as a precharge voltage and a short-circuit MOSFET for short-circuiting the common input/output line pair are formed in an N-well region on a P-type substrate and supplied with the internal voltage, whereby these circuits can be rationally placed and switch and precharge circuits can be activated regardless of a variation in supply voltage.

(5) A still further advantageous effect can be obtained in that a division word line system is adopted in which the word lines are put into lengths divided along the direction in which a main word line extends, and are placed in plural form in a bit line direction intersecting the main word line, and they are formed as sub-word lines respectively connected to the gates of address selection MOSFETs of a plurality of dynamic memory cells, one sub-array referred to above is formed so as to be surrounded by sub-word line driver circuit rows and a plurality of sense amplifier rows, and switch circuits provided separately between sub common input/output line pairs which are provided so as to correspond to the sub-arrays and common input/output line pairs provided so as to correspond a plurality of sub-arrays and connected the main amplifier and which provide connections between the sub common input/output line pairs and the common input/output line pairs to one another, are associated with the four corners of each sub-array and provided in cross areas in which the sense amplifiers and the sub-word line driver circuits intersect, respectively, whereby the above switch circuits can be placed with efficiency with respect to a memory array based on the division word line system.

(6) A still further advantageous effect can be obtained in that each of the sub-word line driver circuits comprises a first CMOS inverter circuit, which is comprised of both a P channel type MOSFET having an input terminal comprised of a common-connected gate to which a main word line is electrically connected, an output terminal to which the sub-word line is electrically connected, and a source to which the second non-inversion sub-word select line is electrically connected, and an N channel type MOSFET whose source is electrically connected to a ground potential; and an N channel type MOSFET whose gate is electrically connected to the first sub-word select line, which is provided between the sub-word line and the circuit ground potential and whose gate is electrically connected to the second inversion sub-word line, a select signal, produced by a sub-word select line driver circuit comprised of a second CMOS inverter circuit in which an input terminal thereof electrically connects the second inversion sub-word select line to the first sub-word select line and electrically connects the second non-inversion sub-word select line to the first sub-word select line, is transmitted to the sub-word line driver circuit, and the sub-word select line driver circuits and the switch circuits are alternately arranged in a plurality of cross areas placed side by side in the word line direction, whereby memory cell arrays can be laid out with efficiency.

(7) A still further advantageous effect can be obtained in that the sense amplifier activation signal supplied to the gate of the first power MOSFET can establish operation timing of a sense amplifier without the influence of a variation in source voltage by setting a pulse width thereof by a delay time produced from a delay circuit activated by the internal voltage, whereby the present operation timing and the stabilization of the amplifying operation of the sense amplifier work synergistically, thereby making it possible to speed up a memory access time.

(8) A still further advantageous effect can be obtained in that since a circuit for producing a timing signal for selecting a column switch MOSFET for electrically connecting the corresponding complementary bit line pair of the sub-array to the sub common input/output line pair is configured by using a delay circuit activated by the internal voltage, such a configuration acts synergistically with the stabilization of the amplifying operation of the sense amplifier, thereby making it possible to speed up a memory access time.

(9) A still further advantageous effect can be brought about in that a timing signal based on each delay circuit activated by the internal voltage is converted into a level corresponding to the supply voltage by a level converter comprising a pair of CMOS inverter circuits receiving complementary signals formed by the internal voltage, and level-conversion P channel type MOSFETs which are provided between P channel type MOSFETs in the pair of CMOS inverter circuits and the supply voltage supplied from the external terminal and whose gates are mutually supplied with signals outputted from the other CMOS interver circuit on a cross basis, whereby timing signals having required voltage levels and drive power can be formed.

The invention, which has been made by the present inventors has been described above specifically by reference to various embodiments. However, the present invention is not necessarily limited to the embodiments. It is needless to say that various changes can be made to the invention within a scope not departing from its substance. For example, the configuration of a sub-array or the placement of a plurality of memory arrays mounted on a semiconductor chip can take various forms according to their storage capacities or the like. Further, the configuration of a sub-word driver can take various forms. An input/output interface portion may be configured as a synchronous dynamic RAM activated in synchronism with a clock signal. Various forms such as eight in addition to four as described above can be taken as the number of sub-word lines assigned to one main word line. This invention is widely available for use in a dynamic RAM.

Advantageous effects obtained by a typical one of the features disclosed in the present application will be briefly described as follows: An N channel type voltage clamp MOSFET is provided which has a drain supplied with a supply voltage supplied from an external terminal, a gate to which a boosted constant voltage is applied, and a source which outputs a constant voltage. The clamp voltage outputted from the source of the voltage clamp MOSFET is supplied to a common source line for each of P channel type amplification MOSFETs constituting a sense amplifier via a P channel type first power MOSFET switch-controlled by a sense amplifier activation signal, as a voltage for operating the sense amplifier. Further, the constant voltage outputted from the source of the voltage clamp MOSFET is supplied to an N-well region in which the P channel type first power MOSFET and the P channel type MOSFETs constituting the sense amplifier are formed, as a bias voltage. As a result, the amplifying operation of the sense amplifier can be stabilized without being affected by a variation in supply voltage.

What is claimed is:

1. A dynamic memory formed on a semiconductor substrate comprising:

a pair of bit lines;

a plurality of word lines;

a plurality of dynamic memory cells, each of which is coupled to one line of said pair of bit lines and one of said plurality of word lines;

a sense amplifier including a pair of PMOS transistors and a pair of NMOS transistors, each of said pairs of PMOS and NMOS transistors having their sources coupled in common, their drains coupled to said pair of bit lines, respectively, and their gates cross-coupled to said drains, respectively;

a first external terminal for receiving a first external supply voltage;

a first NMOS transistor which has a drain coupled to said first external terminal and a gate supplied with a first internal voltage so that a second internal voltage stabilized with respect to said first external supply voltage is derived from a source of said first NMOS transistor; and a first PMOS transistor having a source coupled to said source of said first NMOS transistor and a drain coupled to said sources of said pair of PMOS transistors, wherein said sources and drains of said pair of PMOS transistors and said first PMOS transistor are formed in an N-well in said semiconductor substrate, and wherein said N-well is supplied with said second internal voltage, further comprising:

a switch transistor which has a source-drain path provided between said sources of said pair of PMOS transistors and a terminal supplied with a third internal voltage being lower than said second internal voltage, wherein said sense amplifier provides said pair of bit lines with a pair of complementary signals having a high side voltage and a low side voltage on the basis of information stored in a memory cell selected from said plurality of dynamic memory cells, wherein, in a first period, said high side voltage approaches said second internal voltage in response to said first PMOS transistor being enabled, and wherein, in a second period following said first period, said high side voltage approaches said third internal voltage in response to said switch transistor being enabled.

2. A dynamic memory according to claim 1, further comprising:

a first generator which generates said first internal voltage being higher than said first external supply voltage.

3. A dynamic memory according to claim 2, further comprising:

a second external terminal for receiving a second external supply voltage; and a second NMOS transistor, having a source coupled to said second external terminal and a drain coupled to said sources of said pair of NMOS transistors.

4. A dynamic memory according to claim 3, wherein said second external supply voltage corresponds to a circuit ground potential.

5. A dynamic memory according to claim 2, wherein said switch transistor is an NMOS transistor.

6. A dynamic memory according to claim 1, wherein said first NMOS transistor operates in a saturation mode.

7. A dynamic memory comprising:

a plurality of word lines;

a pair of complementary bit lines;

a plurality of dynamic memory cells provided between one of said plurality of word lines and one line of said pair of complementary bit lines, said each cell having an address selection MOSFET and a storage capacitor;

a sense amplifier comprising a pair of P channel type MOSFETs whose cross-connected gates and drains are respectively coupled to said pair of complementary bit lines and which constitutes an amplifying portion on the supply voltage side, and a pair of N channel type MOSFETs whose cross-connected gates and drains are respectively coupled to said pair of complementary bit lines and which constitutes an amplifying portion on the ground potential side;

a first common source line for allowing the sources of said pair of P channel type MOSFETs of said sense amplifier to be coupled in common;

a second common source line for allowing the sources of said pair of N channel type MOSFETs of said sense amplifier to be coupled in common;

an external terminal supplied with a supply voltage;

an N channel type voltage clamp MOSFET having a drain supplied with the supply voltage and a source which outputs a voltage stabilized with respect to variation in supply voltage;

a P channel type first power MOSFET having a source coupled to the source of said N channel type voltage clamp MOSFET, a gate supplied with a first activation signal and a drain which outputs a voltage to said first common source line; and an N channel type second power MOSFET having a gate supplied with a second activation signal, a source supplied with a circuit around potential and a drain which outputs a ground potential to said second common source line, wherein said P channel type first power MOSFET and said pair of P channel type MOSFETs of said sense amplifier are formed in a first N-well region on a P-type semiconductor substrate, and the voltage outputted from the source of said voltage clamp MOSFET is supplied to the first N-well region, further comprising:

an N channel type third power MOSFET having a gate supplied with a third activation signal, a drain supplied with an internal voltage and a source which outputs a voltage to said first common source line, wherein the voltage outputted from the source of said voltage clamp MOSFET is an overdrive voltage set to a voltage higher than the voltage outputted from said third power MOSFET, and wherein the first activation signal supplied to the gate of said first power MOSFET is an overdrive activation signal.

8. A dynamic memory according to claim 7, wherein the third activation signal supplied to the gate of said third power MOSFET is produced using the supply voltage supplied from the external terminal.

9. A dynamic memory according to claim 7 or 8, further comprising:

a pair of first common input/output lines;

a column switch provided between said pair of first common input/output lines and said pair of complementary bit lines;

a pair of second common input/output lines;

a pair of P channel type switch MOSFETs provided between said first common input/output line pair and said second common input/output line pair; and a pair of P channel type precharge MOSFETs for supplying a predetermined precharge voltage to said second common input/output line pair, wherein said P channel type precharge MOSFET pair and said P channel type switch MOSFET pair are formed in a second N-well region formed on the P-type semiconductor substrate, and the internal voltage supplied to the drain of said third power MOSFET is supplied to the second N-well region.

10. A dynamic memory according to claim 7, wherein the first activation signal supplied to the gate of said first power MOSFET has a pulse width set by a delay time produced from a first delay circuit activated by the internal voltage supplied to the drain of said third power MOSFET.

11. A dynamic memory according to claim 7, 8 or 10, wherein a circuit for producing a timing signal for selecting the column switch is formed using a second delay circuit activated by the internal voltage.

12. A dynamic memory according to claim 10, wherein a timing signal based on said first delay circuit is converted into a level corresponding to the supply voltage by a level converter comprising a pair of CMOS inverter circuits receiving complementary signals formed by the internal voltage, and level-conversion P channel type MOSFETs which are provided between P channel type MOSFETs in the pair of CMOS inverter circuits and the supply voltage supplied from the external terminal and whose gates are mutually supplied with signals outputted from the other CMOS inverter circuit on a cross basis.

13. A dynamic memory according to claim 8, wherein a drive voltage level supplied to the gate of said third power MOSFET is identical to a voltage level supplied to the gate of said voltage clamp MOSFET.

14. A dynamic memory formed on a semiconductor substrate comprising:

a pair of bit lines;

a plurality of word lines;

a plurality of dynamic memory cells, each of which is coupled to one line of said pair of bit lines and one of said plurality of word lines;

a sense amplifier including a pair of PMOS transistors and a pair of NMOS transistors, each of said pairs of PMOS and NMOS transistors having sources coupled in common, drains coupled to said pair of bit lines, respectively, and gates cross-coupled to said drains, respectively;

a first external terminal for receiving a first external supply voltage;

a first voltage generator which generates a first internal voltage stabilized with respect to said first external supply voltage; and a first power switch transistor of P-channel type having a source supplied with said first internal voltage and a drain coupled to said sources of said pair of PMOS transistors, wherein said sources and drains of said pair of PMOS transistors and said first power switch transistor are formed in an N-well in said semiconductor substrate, and wherein said N-well is supplied with said first internal voltage, further comprising:

a second voltage generator which generates a second internal voltage stabilized with respect to said first external supply voltage and being lower than said first internal voltage; and a second power switch transistor which has a source-drain path provided between an output terminal of said second voltage generator and said sources of said pair of PMOS transistors, wherein said sense amplifier provides said pair of bit lines with a pair of complementary signals having a high side voltage and a low side voltage on the basis of information stored in a memory cell selected from said plurality of dynamic memory cells, wherein, in a first period, said high side voltage rises in response to said first power switch transistor being enabled, and wherein, in a second period following said first period, said high side voltage rises in response to said second power switch transistor being enabled.

15. A dynamic memory according to claim 14, wherein said switch transistor is an NMOS transistor.

16. A dynamic memory according to claim 14, wherein said first voltage generator includes an NMOS transistor which operates in a saturation mode.

17. A dynamic memory comprising:

a plurality of word lines;

a plurality of pairs of complementary bit lines;

a plurality of dynamic memory cells, each of which is provided between one of said plurality of word lines and one of said plurality of pairs of complementary bit lines and comprises an address selection MOSFET whose gate is coupled to said word line and whose one source-drain is coupled to said one of the complementary bit lines, and a storage capacitor having one electrode coupled to the other source-drain of said address selection MOSFET and the other electrode supplied with a predetermined voltage;

a sense amplifier which comprises a plurality of pairs of P channel type MOSFETs whose cross-coupled gates and drains are respectively coupled to said plurality of complementary bit line pairs and which constitute an amplifying portion on the supply voltage side, and a plurality of pairs of N channel type MOSFETs whose cross-coupled gates and drains are respectively coupled to said plurality of complementary bit line pairs and which constitute an amplifying portion on the ground potential side;

a first common source line for allowing the sources of said P channel type MOSFETs of said sense amplifier to be coupled in common;

a second common source line for allowing the sources of said N channel type MOSFETs of said sense amplifier to be coupled in common;

a voltage clamp circuit which outputs a constant voltage in response to a supply voltage supplied from an external terminal;

a P channel type first power MOSFET having a source coupled to an output terminal of said voltage clamp circuit, a gate supplied with a sense amplifier activation signal and a drain which outputs an operating voltage to be supplied to said first common source line; and an N channel type second power MOSFET having a gate supplied with a sense amplifier activation signal, a source supplied with a circuit ground potential and a drain which outputs a ground potential to be supplied to said second common source line, wherein the constant voltage outputted from said voltage clamp circuit is supplied to a common N-well region in which said P channel type first power MOSFET and said P channel type MOSFETs constituting the amplifying portion on the supply voltage side are formed.

18. A dynamic memory formed on a semiconductor substrate comprising:

a pair of bit lines;

a plurality of word lines;

a plurality of dynamic memory cells, each of which is coupled to one of said pair of bit lines and one of said plurality of word lines;

a sense amplifier including a pair of PMOS transistors and a pair of NMOS transistors, each of said pairs of PMOS and NMOS transistors having sources coupled in common, drains coupled to said pair of bit lines, respectively, and gates cross-coupled to said drains, respectively;

a first external terminal for receiving a first external supply voltage;

a first NMOS transistor which has a drain coupled to said first external terminal and a gate supplied with a first internal voltage so that a second internal voltage stabilized with respect to said first external supply voltage is derived from a source of said first NMOS transistor; and a first PMOS transistor, having a source coupled to said source of said first NMOS transistor and a drain coupled to said sources of said pair of PMOS transistors, wherein said sources and drains of said pair of PMOS transistors and said first PMOS transistor are formed in a common N-well region in said semiconductor substrate, and wherein said N-well region is supplied with said second internal voltage.

* * * * *